US010020042B2

(12) United States Patent
Evans, Jr. et al.

(10) Patent No.: US 10,020,042 B2
(45) Date of Patent: Jul. 10, 2018

(54) CMOS ANALOG MEMORIES UTILIZING FERROELECTRIC CAPACITORS

(71) Applicant: Radiant Technologies, Inc., San Ramon, CA (US)

(72) Inventors: Joseph T. Evans, Jr., Albuquerque, NM (US); Calvin B. Ward, Castro Valley, CA (US)

(73) Assignee: Radiant Technologies, Inc., Albuquerque, NM (US)

( * ) Notice: Subject to any disclaimer, the term of this patent is extended or adjusted under 35 U.S.C. 154(b) by 0 days.

(21) Appl. No.: 15/271,145

(22) Filed: Sep. 20, 2016

(65) Prior Publication Data
US 2017/0011789 A1 Jan. 12, 2017

Related U.S. Application Data

(60) Division of application No. 15/072,292, filed on Mar. 16, 2016, now Pat. No. 9,496,019, which is a division of application No. 14/498,911, filed on Sep. 26, 2014, (Continued)

(51) Int. Cl.
*G11C 11/22* (2006.01)
*G11C 11/56* (2006.01)

(52) U.S. Cl.
CPC ........ *G11C 11/221* (2013.01); *G11C 11/2273* (2013.01); *G11C 11/2275* (2013.01); *G11C 11/5657* (2013.01); *G11C 11/22* (2013.01)

(58) Field of Classification Search
CPC .............. G11C 11/221; G11C 11/2273; G11C 11/2275; G11C 11/22; G11C 11/5657; G11C 11/225; G11C 11/2259; G11C 11/2253; G11C 11/419; G11C 7/12; G11C 11/165; G11C 11/1657; G11C 11/1659;
(Continued)

(56) References Cited

U.S. PATENT DOCUMENTS 5,751,627 A * 5/1998 Ooishi .................... G11C 11/22
365/145
6,947,310 B1 * 9/2005 Marshall ................. G11C 11/22
365/145

(Continued)

OTHER PUBLICATIONS

Preliminary Report on Patentability dated Apr. 6, 2017, PCT/US2015/049004.
(Continued)

*Primary Examiner* — Uyen B Tran
(74) *Attorney, Agent, or Firm* — Calvin B. Ward

(57) ABSTRACT

A memory cell and memories constructed from that memory cell are disclosed. A memory according to the present invention includes a ferroelectric capacitor, a charge source and a read circuit. The charge source receives a data value to be stored in the ferroelectric capacitor. The charge source converts the data value to a remanent charge to be stored in the ferroelectric capacitor and causes that remanent charge to be stored in the ferroelectric capacitor. The read circuit determines a charge stored in the ferroelectric capacitor. The data value has more than three distinct possible states, and the determined charge has more than three determined values. The memory also includes a reset circuit that causes the ferroelectric capacitor to enter a predetermined known reference state of polarization.

9 Claims, 16 Drawing Sheets

Related U.S. Application Data now Pat. No. 9,324,405, which is a continuation-in-part of application No. 14/274,616, filed on May 9, 2014, now Pat. No. 8,964,446, which is a continuation of application No. 12/956,845, filed on Nov. 30, 2010, now Pat. No. 8,760,907.

(58) Field of Classification Search
CPC ............ G11C 11/1675; G11C 11/409; G11C 11/4091; G11C 11/4094; G11C 13/0021; G11C 13/004; G11C 14/0027; G11C 15/043; G11C 16/10; G11C 17/12; G11C 5/06
See application file for complete search history.

(56) References Cited

U.S. PATENT DOCUMENTS

| | | | |
|---|---|---|---|
| 2002/0044477 A1* | 4/2002 | Takeuchi | G11C 11/22 365/145 |
| 2005/0046438 A1* | 3/2005 | Tam | G01R 19/0023 324/76.11 |
| 2012/0134196 A1 | 5/2012 | Evans | |
| 2013/0188411 A1 | 7/2013 | Evans | |

OTHER PUBLICATIONS

Partial Supplementary European Search Report dated Nov. 20, 2017, EP Application No. 15843354.0.
Extended European Search Report dated Mar. 26, 2018, EP Application No. 15843354.0.

\* cited by examiner

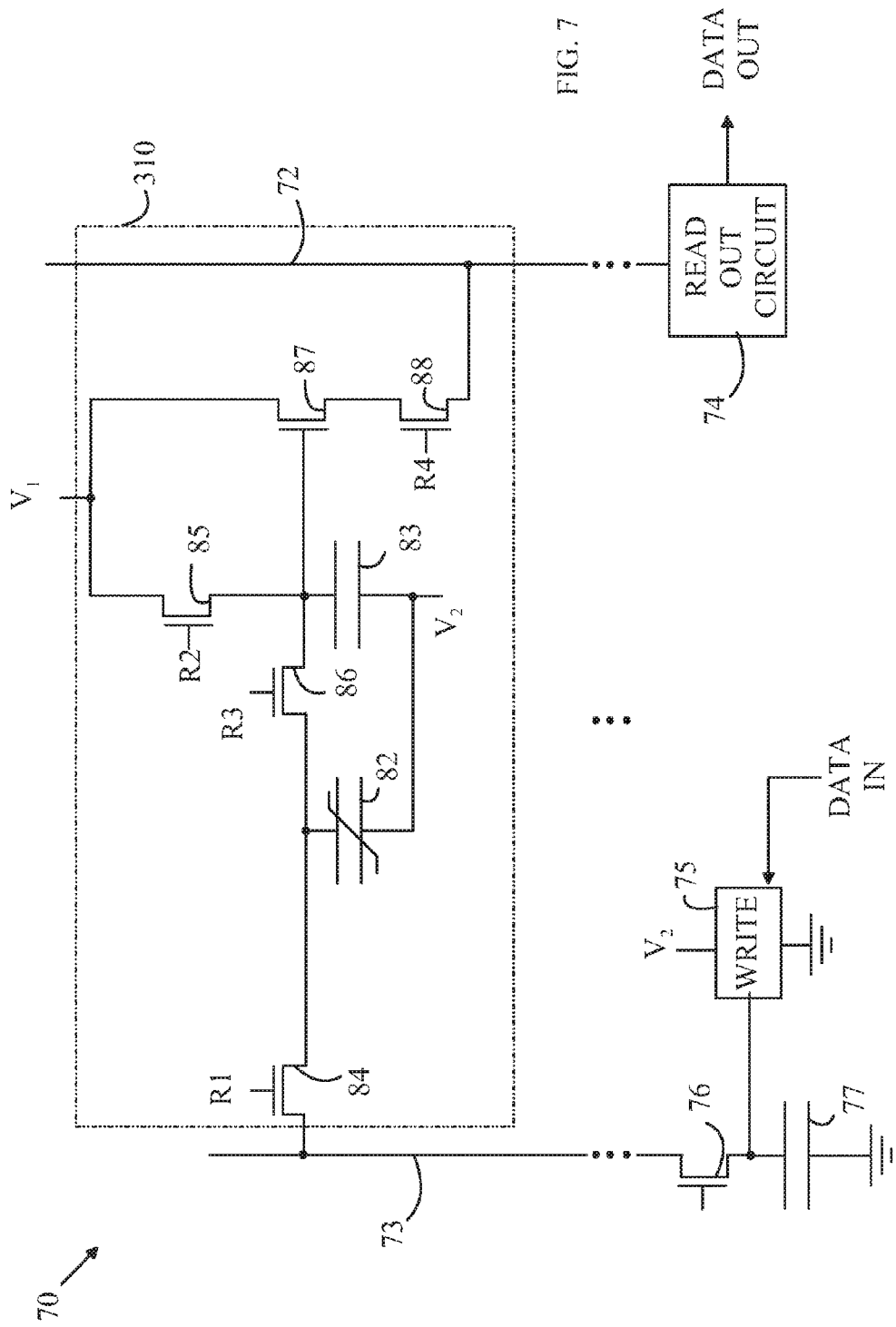

CMOS ANALOG MEMORIES UTILIZING FERROELECTRIC CAPACITORS

RELATED APPLICATIONS

This application is a divisional of U.S. patent application Ser. No. 15/072,292, filed Mar. 16, 2016, which is a divisional of U.S. patent application Ser. No. 14/498,911 filed Sep. 26, 2014, now U.S. Pat. No. 9,324,405, which is a continuation in part of U.S. patent application Ser. No. 14/274,616 filed May 9, 2014, now U.S. Pat. No. 8,964,446, which is a continuation of U.S. patent application Ser. No. 12/956,845 filed on Nov. 30, 2010, now U.S. Pat. No. 8,760,907.

BACKGROUND

Non-volatile solid-state EEPROM memories have become competitive with conventional rotating magnetic disk media for large-scale data storage in applications requiring high speed and/or low power consumption. Such memories have much shorter effective "seek" times and data transfer rates that are as fast as, or faster than, the conventional disk drives. In addition, these memories can withstand significant mechanical shocks and require a fraction of the power of conventional disk drives. The cost of such memories, however, still places limitations on the use of the drives. In addition, such memories are not usable in high radiation environments.

One method for reducing the cost of such memories utilizes memory cells that have more than two storage states. For example, in EEPROM memories, a charge is deposited on a floating gate using tunneling. The charge alters the conductivity of the associated transistor. In a binary memory, the presence or absence of the charge is all that needs to be sensed. In a multi-state memory, each state corresponds to a different amount of charge being transferred to the gate. To read the cell, the conductivity of the cell must be measured to differentiate between the possible states. Since each cell now stores multiple bits of data, the cost of the memory is substantially reduced for any given memory size.

Unfortunately, the time to write such a cell is significantly greater than the time to write a binary cell. Furthermore, the maximum number of states that can be stored in a memory cell is limited. These problems can be partially overcome by increasing the number of sense amplifiers in the memory so that a large number of cells are read or written simultaneously. However, this approach increases the cost of the memory and still imposes an initial read time for a "track" that is longer than the read times for reading out individual segments of the track once the track has been loaded.

When data is to be rewritten in a record, the entire record must be erased and then the new data entered. Since the erase time is long compared to the write time, data is rewritten to unused records that have been erased. The records that were abandoned in a prior rewrite are then erased in the background. This "garbage collection" procedure further complicates the memories and increases the cost. Finally, the number of times a cell can be erased and rewritten is limited, and hence, the lifetime of the memory can be a problem in applications that require a large number of cells to be erased and rewritten a large number of times.

SUMMARY

The present invention includes a memory cell and memories constructed from that memory cell. In one embodiment, a memory according to the present invention includes a ferroelectric capacitor, a charge source and a read circuit. The charge source receives a data value to be stored in the ferroelectric capacitor. The charge source converts the data value to a remanent charge to be stored in the ferroelectric capacitor and causes that remanent charge to be stored in the ferroelectric capacitor. The read circuit determines a charge stored in the ferroelectric capacitor. The data value has more than three distinct possible states, and the determined charge has more than three determined values. The memory also includes a reset circuit that causes the ferroelectric capacitor to enter a predetermined known reference state of polarization.

In one aspect of the invention, the charge source includes a capacitor charging circuit that charges a capacitor to a voltage determined by the data value and a switch that connects the capacitor after the charging in parallel with the ferroelectric capacitor.

In another aspect of the invention, the charge source includes a current source that is connected to the ferroelectric capacitor for a time period determined by the data value.

In a still further aspect of the invention, the current source includes a circuit having first and second current paths connected between first and second switch terminals. The ferroelectric capacitor is connected in series in the first current path such that a current equal to a fixed fraction of a current entering the first switch terminal passes into the ferroelectric capacitor substantially independent of the current.

In another aspect of the invention, the ferroelectric capacitor is characterized by saturation voltage, and the read circuit includes a read capacitor and a precharge circuit that charges the read capacitor to a voltage above the saturation voltage. The read circuit also includes a switch that connects the ferroelectric capacitor to the read capacitor and an output circuit that generates a signal indicative of a voltage on the read capacitor after the read ferroelectric capacitor is connected to the read capacitor.

In a still further aspect, the ferroelectric capacitor is characterized by a maximum remanent charge that can be stored in the ferroelectric capacitor, and the read circuit includes a maximum charge stored circuit that determines when the ferroelectric capacitor stores the maximum remanent charge. A controller causes the charge source to add charge to the ferroelectric capacitor until the maximum charge circuit determines that the ferroelectric capacitor is storing the maximum remanent charge.

In another aspect of the invention, a memory cell according to the present invention includes a ferroelectric capacitor and a circuit having first and second current paths connected between first and second switch terminals. The ferroelectric capacitor is connected in series in the first current path such that a current equal to a fixed fraction of a current entering the first switch terminal passes into the ferroelectric capacitor substantially independent of the current.

In one aspect of the invention, the first current path includes the ferroelectric capacitor in series with a first FET having a gate shorted to a source of the FET, and second current path includes a second FET connected between the first and second terminals.

In another aspect of the invention, the ferroelectric capacitor is characterized by first and second ferroelectric capacitor terminals, the first ferroelectric capacitor terminal is connected to the first switch terminal, and the first current path includes a first FET having a source connected to the second ferroelectric capacitor terminal and a second FET having a source connected to a drain of the first FET and a drain connected to the second switch terminal, the second FET having a gate connected to the second ferroelectric capacitor terminal.

In a still further aspect of the invention, the ferroelectric capacitor is characterized by a maximum charge that can be stored in the ferroelectric capacitor, the memory cell further includes a write circuit connected to the first switch terminal, the write circuit transferring a quantity of charge through the first switch terminal, the quantity of charge is determined by a data value input to the write circuit and is independent of the maximum charge.

In another aspect of the invention, the memory cell includes a read circuit that determines an amount of charge that has been stored in the ferroelectric capacitor by the write circuit. The read circuit can include a reset capacitor and a circuit for precharging the reset capacitor to a first voltage. A circuit connects the reset capacitor to the ferroelectric capacitor after the reset capacitor has been charged to the first voltage, and a circuit that measures a voltage on the reset capacitor after the reset capacitor has been connected to the ferroelectric capacitor.

In a still further aspect of the invention, the ferroelectric capacitor is characterized by a maximum charge that can be stored on the ferroelectric capacitor and a saturation voltage and the first voltage is chosen such that the capacitor is at a voltage greater than the saturation voltage when a charge equal to the maximum charge is transferred from the ferroelectric capacitor to the reset capacitor.

In another aspect of the invention, the ferroelectric capacitor is characterized by a maximum charge that can be stored on the ferroelectric capacitor and the read circuit determines a charge that must be added to a charge stored in the ferroelectric capacitor to cause the ferroelectric capacitor to store the maximum charge.

A ferroelectric memory according to one aspect of the invention includes a read line, a write line, and a plurality of ferroelectric memory cells, each ferroelectric memory cell includes a ferroelectric capacitor characterized by a maximum charge that can be stored in the ferroelectric capacitor. The ferroelectric memory also includes a plurality of ferroelectric memory cell select buses, one of the select buses corresponding to each of the ferroelectric memory cells. Each of the ferroelectric memory cells includes first and second gates for connecting the ferroelectric memory cell to the read line and the write line, respectively, in response to signals on the ferroelectric memory cell select bus corresponding to that ferroelectric memory cell. A write circuit causes a charge to be stored in the ferroelectric capacitor of the ferroelectric memory cell currently connected to the write line, the charge having a value determined by a data value input to the write circuit. The charge is independent of the maximum charge of the ferroelectric capacitor. A read circuit measures the charge stored in the ferroelectric capacitor of the ferroelectric memory cell currently connected to the read line to generate an output value, the output value corresponding to a data value currently stored in the ferroelectric capacitor.

In one aspect of the invention, the read line includes a first branch of a current mirror and the ferroelectric memory cell includes a second branch of the current mirror, the first and second branches of the current mirror being configured such that a fixed fraction of current entering the ferroelectric memory cell enters the ferroelectric capacitor in the ferroelectric memory cell, the fixed fraction is independent of the maximum charge of the ferroelectric capacitor connected to the read line. In one aspect of the invention, the data value has more than three different values.

In another aspect of the invention, the memory includes a read circuit that determines a charge currently stored in the ferroelectric capacitor connected to the read line. The charge can be determined by measuring a charge that leaves the ferroelectric capacitor when the ferroelectric capacitor is reset to a fully polarized state. Alternatively, the charge can be determined by measuring a charge that must be added to the charge in the ferroelectric capacitor to cause the ferroelectric capacitor to be reset to a fully polarized state.

BRIEF DESCRIPTION OF THE DRAWINGS

FIG. 7 illustrates one embodiment of a ferroelectric memory according to the present invention that utilizes the storage scheme discussed in which data is readout by measuring the amount of charge that was stored in the ferroelectric capacitor during the writing operation.

DETAILED DESCRIPTION

The circuits discussed in this application include two types of capacitors. The first type is a ferroelectric capacitor, which is a capacitor with a ferroelectric material as the dielectric in that capacitor. The second type is a conventional capacitor, which has a non-ferroelectric material as its dielectric layer. The term capacitor will be used for the conventional capacitor in the following discussion unless the context indicates otherwise.

The manner in which the present invention provides its advantages can be more easily understood with reference to the problems encountered by prior art ferroelectric capacitor memories that attempt to store more than two states per ferroelectric capacitor. Ferroelectric memories are based on a model in which data values are mapped to particular states of polarization of the ferroelectric dielectric by applying a write voltage across the ferroelectric capacitor that corresponds to each state. The polarization state of the dielectric is sensed by applying a read voltage across the ferroelectric capacitor that causes the dielectric to be fully polarized in a known direction and observing any charge that leaves one plate of the ferroelectric capacitor as a result of applying the read voltage.

Such schemes are complicated by the fact that the polarization state of a ferroelectric dielectric as a function of the applied voltage across the ferroelectric capacitor exhibits hysteresis. That is, the remanent polarization that is left in the ferroelectric capacitor when the voltage is removed is a function of the history of the voltage across the ferroelectric capacitor since the last time the ferroelectric capacitor was fully polarized. Hence, with the exception of two particular write voltages, merely applying a voltage that is between these write voltages does not lead to a reproducible state of polarization when the voltage is removed. The two write voltages that lead to known states of polarization independent of the previous short term history of the ferroelectric capacitor are the write voltages that fully polarize the dielectric in either the up or down directions. The voltage that provides this complete polarization is referred to as the saturation voltage and will be denoted by $V_c$. If a voltage that is greater than $V_c$ is used, no further remanent polarization takes place. If a voltage that is less than $V_c$ is used, the state of polarization will depend on the history of the ferroelectric capacitor prior to applying that write voltage.

As a result of the problems associated with using intermediate voltages, prior art ferroelectric memories based on ferroelectric capacitors are limited to two states that correspond to $V_c$ and $-V_c$ being used as the writing voltages for storing the data. Either of these voltages can be used as the read voltage.

Figure 15A:
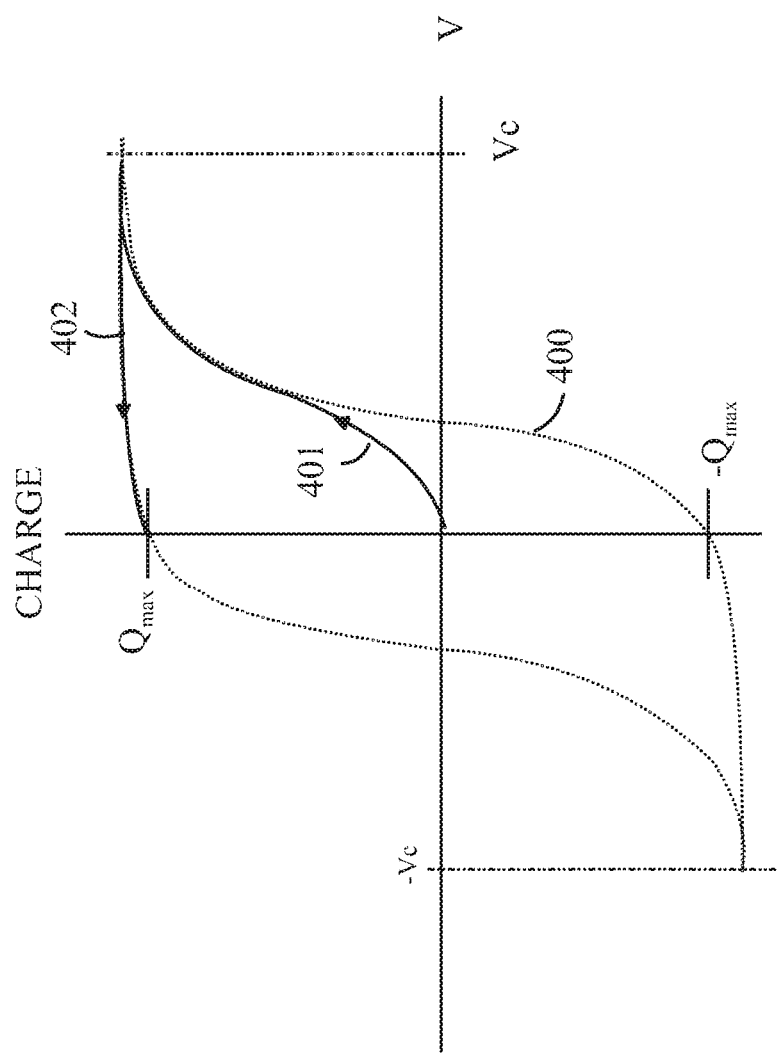
FIG. 15A illustrates the relationship between the applied voltages and the charge that is stored in the ferroelectric capacitor.

Schemes for using intermediate write voltages to set intermediate states of polarization have been proposed. To avoid the problems associated with the memory of the ferroelectric capacitor, the intermediate state is set by first setting the ferroelectric capacitor to one of the fully polarized states and then applying an intermediate write voltage that tends to polarize the ferroelectric capacitor in the opposite polarization state. Refer now to FIG. 15A that illustrates the relationship between the applied voltages and the charge that is stored in the ferroelectric capacitor. It should be noted that the stored charge is a direct measure of the polarization of the dielectric, since the charge is attracted by the remanent polarization of the dielectric. When the ferroelectric capacitor is first fabricated, the ferroelectric material is not polarized. Consider the case in which a positive voltage of $V_c$ is applied across the capacitor. The charge in the ferroelectric capacitor increases along curve 401 until it reaches a maximum at $V_c$. If the voltage across the ferroelectric capacitor is now removed, the charge decreases to $Q_{max}$, along curve 402, which is part of the hysteresis loop 400. Here, $Q_{max}$ is the maximum remanent charge that is stored by the ferroelectric capacitor when no voltage is applied.

Figure 15B:
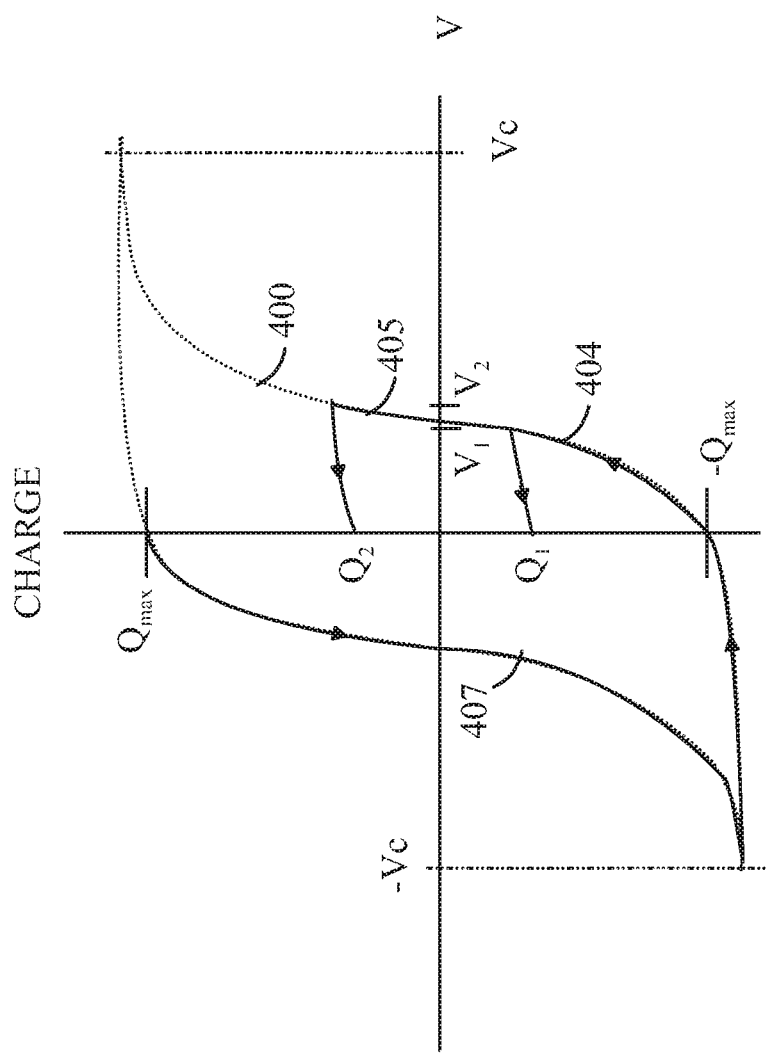
FIG. 15B illustrates the problems associated with trying to use an intermediate voltage to establish an intermediate polarization value.

Refer now to FIG. 15B which illustrates the problems associated with trying to use an intermediate voltage to establish an intermediate polarization value. The ferroelectric capacitor is assumed to start from the point at which it was left by the application of $V_c$ as discussed above. To establish the partial polarization, the ferroelectric capacitor is first cycled to $-V_c$ along curve 407 and then the voltage is increased from $-V_c$ to $V_1$. The charge as a function of voltage is shown at 404. Once the ferroelectric capacitor is established at $V_1$, the voltage is removed leaving a remanent charge of $Q_1$ in the ferroelectric capacitor. If a voltage of $V_2$ that was slightly higher than $V_1$ had been used, the polarization would continue along path 405 and the final remanent charge would be $Q_2$. Hence, a small change in the programming voltage results in a large change in the remanent charge. This problem arises from the steep slope of the hysteresis curve, which magnifies any errors in the programming voltage.

These schemes assume that the hysteresis loop that characterizes a particular ferroelectric capacitor remains constant and that the hysteresis loops of all ferroelectric capacitors in a memory are the same, since the programming voltage corresponding to a particular state that is to be stored in different ferroelectric capacitors cannot be programmed differently for the different ferroelectric capacitors. It is clear from FIG. 15B that the degree of remanent charge stored by an intermediate voltage is a sensitive function of the shape of the hysteresis loop characterizing that particular ferroelectric capacitor. Small changes in the shape or location of the hysteresis loop lead to large changes in the remanent charge that is left after the programming voltage is removed.

For example, it is well known that the hysteresis loops change with temperature. In fact, such changes form the basis of infrared imaging systems based on ferroelectrics. In addition, the hysteresis loops exhibit shifts in location and shape that depend on the programming history of the ferroelectric capacitor. Hence, even with a single ferroelectric capacitor, the shifts in the hysteresis loops make it difficult to establish a relationship between a programming voltage and a remanent charge.

Furthermore, different ferroelectric capacitors within a memory can have significantly different hysteresis loops because the hysteresis loops also depend on the long term voltage history of the ferroelectric capacitor. In addition, the shape of the hysteresis loops depends on the conditions under which the ferroelectric capacitors were fabricated.

Accordingly, there is not a one-to-one relationship between an intermediate voltage applied to a ferroelectric capacitor and amount of remanent charge stored in the ferroelectric capacitor when the voltage is removed even for a single ferroelectric capacitor. That is, a ferroelectric capacitor is repeatedly programmed with the same programming voltage and the stored charge is readout each time, the observed stored charge will exhibit a statistical distribution with a significant width that limits the number of states that can actually be detected. This distribution is even wider when all of the ferroelectric capacitors in a memory are subjected to the same programming readout and the total statistical distribution measured.

These problems do not have the same impact on digital memories that utilize only programming voltages that are greater than $V_c$, since the remanent charge left by these programming voltages does not depend on the details of the shape of the hysteresis loops between $-V_c$ and $+V_c$.

Figure 16:
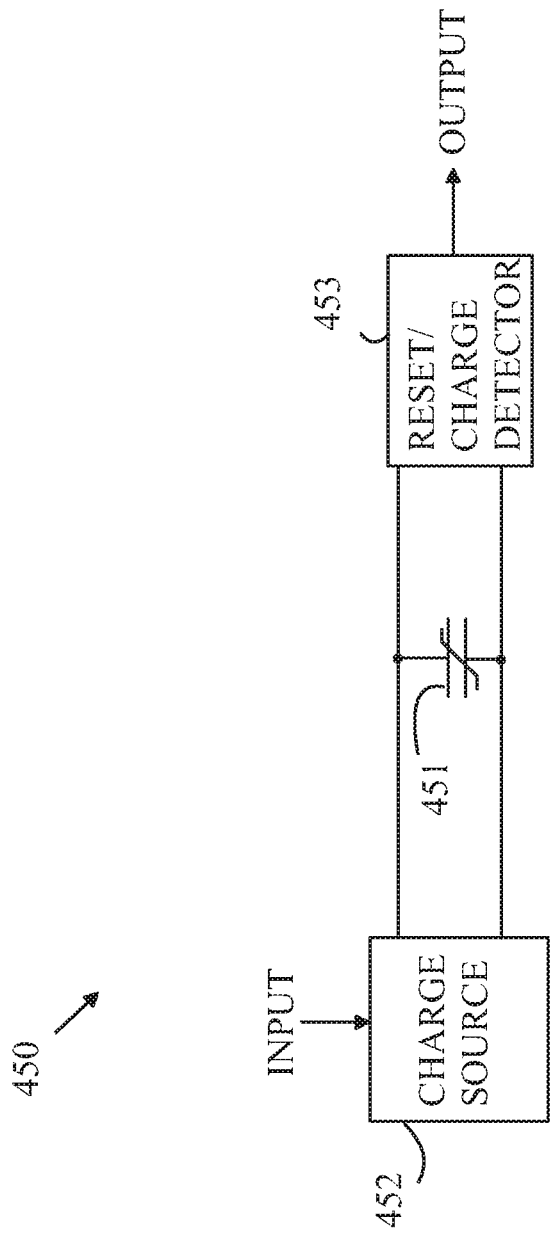
FIG. 16 illustrates the general arrangement of a ferroelectric capacitor based memory according to the present invention.

The present invention avoids these problems by programming the ferroelectric capacitors using a charge source rather than a voltage source to write data into the ferroelectric capacitor. Refer now to FIG. 16, which illustrates the general arrangement of a ferroelectric capacitor based memory according to the present invention. Memory 450 has only one ferroelectric capacitor that stores a plurality of data states. The number of data states that can be stored in ferroelectric capacitor 451 is greater than three. Ferroelectric capacitor 451 is programmed by a charge source 452 that receives a data value that is to be stored in ferroelectric capacitor 451 or added to the data value already stored in ferroelectric capacitor 451. A reset/charge detector 453 measures the charge that is stored in ferroelectric capacitor 451 and resets ferroelectric capacitor 451 to a reset state of polarization. The reset state can be one of the fully polarized states or a state that is displaced from one of the fully polarized states by a known remanent charge.

Once ferroelectric capacitor 451 has been reset, charges can be added to the charge already stored in ferroelectric capacitor 451, thereby implementing an accumulator function. Charge source 452 adds charge to ferroelectric capacitor 451 without relying on any knowledge of the charge that is already stored in ferroelectric capacitor 451. Hence, multiple charges can be added to ferroelectric capacitor 451 prior to ferroelectric capacitor 451 being readout by reset/charge detector 453. Reset/charge detector 453 determines the charge that has been stored in ferroelectric capacitor 451 since the ferroelectric capacitor 451 was reset; hence, the total of all of the stored charges is obtained. It should be noted that prior art systems that rely on intermediate voltage source programming cannot perform this function, since such systems must know the current state of polarization in order to compute the voltage corresponding to the sum of the data values.

For the purposes of the present discussion, a charge source is defined to be a programming source that adds a specified remanent charge to the remanent charge currently in the ferroelectric capacitor without relying on the shape of the hysteresis loop between $+V_c$ and $-V_c$ to deliver the charge in question or knowledge of the remanent charge currently stored in the ferroelectric capacitor. The remanent charge provided by such a charge source must be substantially independent of the shape of the hysteresis loop of the particular ferroelectric capacitor over a wide range of charges between $-Q_{max}$ and $Q_{max}$. Furthermore, the charge deposited by a charge source is not a function of the remanent charge in the ferroelectric capacitor prior to that charge being input to the ferroelectric capacitor so long as the sum of the charges does not exceed $Q_{max}$. While a voltage source that applies a fixed voltage less than $V_c$ to a ferroelectric capacitor results in a remanent charge being stored in the ferroelectric capacitor, the voltage source is not a charge source as defined herein because the amount of charge left is a sensitive function of the shape and location of the hysteresis loop of the ferroelectric capacitor being programmed.

Figure 17:
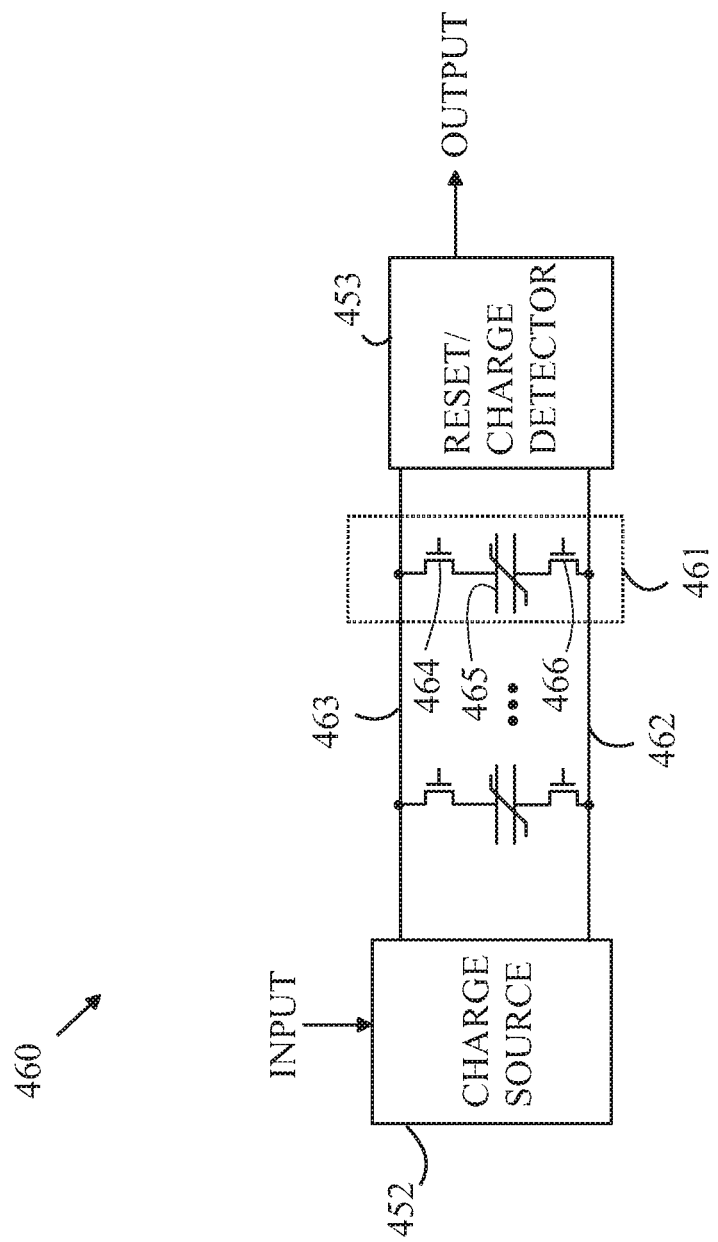
FIG. 17 illustrates a memory with a plurality of ferroelectric capacitor memory cells.

Refer now to FIG. 17, which illustrates a memory with a plurality of ferroelectric capacitor memory cells. Memory 460 includes a plurality of ferroelectric capacitor memory cells such as ferroelectric capacitor memory cell 461. Each ferroelectric capacitor memory cell includes a ferroelectric capacitor 465 and first and second gates 464 and 466. An individual ferroelectric capacitor memory cell is connected to buses 462 and 463 by the gates in that ferroelectric capacitor memory cell. A controller that has been omitted from the diagram determines which ferroelectric capacitor memory cell is connected to the buses at any given time. Charge source 452 and reset/charge detector 453 are shared by all of the ferroelectric capacitor memory cells.

In the embodiment shown in FIG. 17, none of the components of charge source 452 and reset/charge detector 453 are included in the ferroelectric capacitor memory cells. However, as will be explained in more detail below, the individual ferroelectric capacitor memory cells may also include components that are part of the charge source or reset/charge detector function.

Figure 1:
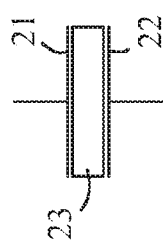
FIG. 1 illustrates a typical ferroelectric capacitor.

Refer now to FIG. 1, which illustrates a typical ferroelectric capacitor. For the purposes of this discussion, a ferroelectric capacitor is defined to be a capacitor having a ferroelectric dielectric material such as lead zirconate titanate (PZT) sandwiched between first and second electrodes in which the dielectric material exhibits a remanent polarization when a potential is applied across the electrodes and then removed. The simplest form of capacitor is a parallel plate capacitor having electrodes 21 and 22 in which a dielectric layer 23 includes a ferroelectric material such as PZT. To simplify the following discussion, a ferroelectric capacitor having a single pair of parallel plates that sandwich the dielectric will be used in the examples. However, other geometries are possible. For example, a capacitor having interdigitated electrodes (interlaced fingers) with a dielectric between each pair of electrodes could also be utilized.

The dielectric layer can be polarized by applying an appropriate voltage across the electrodes of the capacitor. The state of polarization can be characterized by the direction in which the domains within the dielectric layer are aligned. The ferroelectric capacitor will be said to be polarized in the "UP" direction if the direction of polarization corresponds to the case in which the polarizing potential creates an electric field that points from electrode 22 to electrode 21. Similarly, the ferroelectric capacitor will be said to be polarized in the "DOWN" direction if the direction of polarization corresponds to the case in which the polarizing potential creates an electric field that points from electrode 21 to electrode 22.

To cancel the electric fields produced by the remanent polarization, an electric charge is stored on the plates of the capacitor. The amount of charge that is stored will depend on the state of polarization of the dielectric, higher degrees of polarization resulting in higher quantities of charge being stored. When a ferroelectric capacitor is fully polarized in the DOWN direction and is then subjected to a voltage equal to the $V_c$ which polarizes the dielectric in the UP direction, $Q_{max}$ leaves one plate of the ferroelectric capacitor and flows to the other plate.

In a conventional binary ferroelectric memory, the direction of polarization is used to store the value of a single bit. For example, polarizations in the UP and DOWN directions could correspond to bit values of "1" and "0", respectively. The bit value is written by applying an appropriate voltage across the electrodes of the capacitor. The bit value that is stored in the capacitor is determined by applying a voltage across the electrodes of the capacitor that would normally program the capacitor in the UP direction and observing the charge that flows from, or into, one of the electrodes of the capacitor. If the capacitor is in the UP state when the voltage is applied, little charge will flow; however, if the capacitor is in the DOWN state, the state of the capacitor will be switched to the UP state and more charge will flow from or into the electrode in question.

In a conventional binary ferroelectric memory, the programming voltages are set to be sufficiently high to ensure that the dielectric is completely polarized in the desired direction. That is, no additional remanent polarization would be obtained by using a larger programming voltage difference between the electrodes.

The present invention is based on the observation that there is a continuum of remanent polarization states between fully UP and fully DOWN, and that these intermediate states can be programmed by controlling the charge that is transferred to the ferroelectric capacitor. The intermediate state can also be read by measuring the charge that flows when the capacitor is reset to a known fully saturated state.

Figure 2:
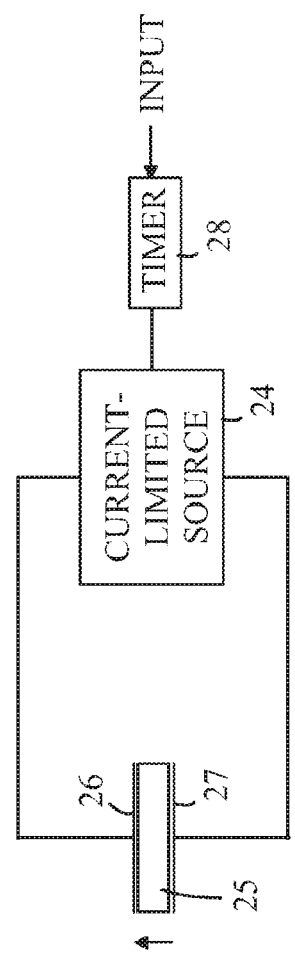
FIG. 2 illustrates the basic programming principle used in the present invention and one possible programming arrangement.

Refer now to FIG. 2, which illustrates the basic programming principle used in the present invention and one possible programming arrangement. At the beginning of the programming cycle, ferroelectric capacitor 25 is programmed in the UP direction as indicated by the arrow. This is accomplished by increasing the potential of electrode 26 relative to electrode 27 by an amount that fully polarizes the dielectric layer in the indicated direction using current-limiting source 24.

To set an intermediate polarization state, current-limiting source 24 applies the opposite potential across ferroelectric capacitor 25; however, the current that is allowed to flow is limited no that the time to completely flip the polarization is extended beyond the time that would normally be needed if a non-limited current source were used. The present invention is based on the observation that ferroelectric capacitor 25 will be left in an intermediate polarization state if the process is terminated before the polarization has completely flipped. Hence, if current-limiting source 24 is a constant current source, the state of polarization of ferroelectric capacitor 25 will be a function of the programming time. For example, a timer 28 that determines the length of time that current-limiting source 24 is on can be used to convert an input value to the intermediate polarization state.

Ferroelectric capacitor 25 can be viewed as a charge storage device. The remanent polarization gives rise to a remanent electric field in the dielectric. To cancel this electric field, the charge moves from one electrode of the capacitor to the other, such that the mobile charge creates an electric field that exactly cancels the polarization electric field. Denote the amount of charge that flows from capacitor electrode 26 to electrode 27 when the direction of polarization is completely flipped by $Q_{max}$. This charge can be viewed as being stored on one of the electrodes, depending on the direction of polarization of the dielectric. If a charge is now forced onto the opposite plate by the programming source, the state of polarization will be changed by an amount that depends on the amount of charge that is transferred. To force the charge onto the opposite plate, the direction of the applied voltage must be opposite that used to "reset" the ferroelectric capacitor to the known fully polarized state.

The charge on the plates completely cancels the electric field of the remanent polarization such that a volt meter will read zero volts across the capacitor even though remanent polarization is present, and the shorting of the electrodes will not discharge the remanent polarization.

Any circuit arrangement that delivers a known charge to the opposite plate can be used to program the ferroelectric capacitor to an intermediate state provided that charge is less than $Q_{max}$ and is delivered at a voltage that alters the remanent polarization such that the charge stored on the capacitor when the programming voltage is removed is altered by the known charge in question. The arrangement discussed above that utilizes a constant current source is one such example, since the charge transferred is equal to the current multiplied by the programming time. However, other arrangements could be utilized.

Figure 3:
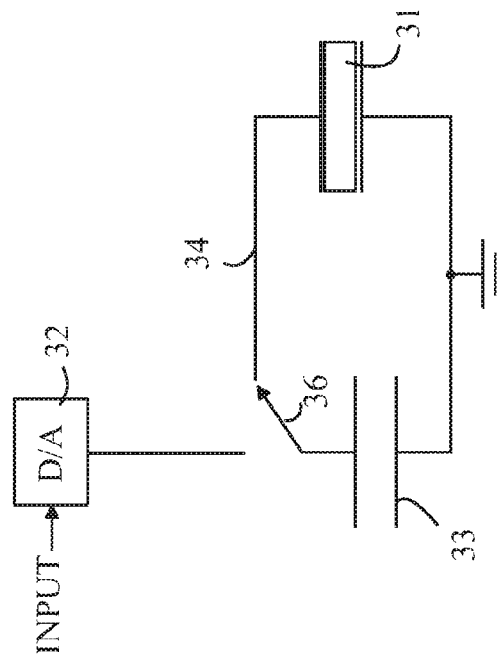
FIG. 3 illustrates another programming arrangement.

Refer now to FIG. 3, which illustrates another programming arrangement. In this embodiment, a digital-to-analog converter 32 is used to convert the input value to a voltage that is applied to a capacitor 33 when switch 36 is set to connect digital-to-analog converter 32 to capacitor 33. After capacitor 33 is charged, switch 36 is used to connect capacitor 33 to ferroelectric capacitor 31, which has already been reset. Charge from capacitor 33 then flows into ferroelectric capacitor 31. Denote the voltage on capacitor 33 prior to switching by $V_1$, and denote the voltage on line 34 after switching by $V_2$. Then the charge transferred to ferroelectric capacitor 31 is $C(V_1-V_2)$, where C is the capacitance of capacitor 33. If $V_1 > V_2$, the transferred charge is proportional to the input value for a linear digital-to-analog converter. In either case, a calibration curve can be provided that maps the input state to the amount of charge that is transferred. Alternatively, digital-to-analog converter 32 can utilize a non-linear transfer function to compensate for $V_2$.

It should be noted that the combination of current-limiting source 24 and timer 28 shown in FIG. 2 and the combination of digital-to-analog converter 32, switch 36, and capacitor 33 shown in FIG. 3 can each be viewed as a "charge source" that transfers to the corresponding ferroelectric capacitors a fixed amount of charge that is determined by the data value. The amount of charge transferred is independent of the hysteresis curves and saturation voltages of the ferroelectric capacitors in question, provided the charge is less than the maximum charge, $Q_{max}$, that the ferroelectric capacitor can store when no voltage is applied across the ferroelectric capacitor. Consider two different ferroelectric capacitors having slightly different $Q_{max}$ values and/or slightly different hysteresis curves. When a charge of Q is forced into each of the capacitors, the capacitors will have slightly different coordinates on their respective hysteresis curves that result from differences in properties of the ferroelectric capacitors even though the ferroelectric capacitors store the same charge.

The amount of charge that is stored in a ferroelectric capacitor after it is initialized to the fully UP condition can be determined by measuring the amount of charge that flows between the electrodes of ferroelectric capacitor 25 when a reset voltage is applied across the ferroelectric capacitor that is sufficient to fully return the ferroelectric capacitor to the UP direction. Consider the two different ferroelectric capacitors discussed above. The voltage difference across the ferroelectric capacitor that must be applied to fully program a capacitor in the UP or DOWN direction will be referred to as the saturation voltage in the following discussion. Differences between the individual ferroelectric capacitors can result in different saturation voltages for the two ferroelectric capacitors. However, if the reset voltage used to measure the stored charge is greater than the maximum of the two saturation voltages, the amount of charge that flows from each of the ferroelectric capacitors after being written with the same charge will be the same even though the ferroelectric capacitors have slightly different properties and the amount of charge written put them on different points of their respective hysteresis.

Alternatively, the charge can be sensed by measuring the amount of charge that must flow into the capacitor to fully continue the capacitor in the DOWN state. This type of read circuit, however, requires the two capacitors to have the same $Q_{max}$, since the read circuit is measuring the difference in charge between the current charge stored in the ferroelectric capacitor and the $Q_{max}$ of that capacitor.

It should be noted that the amount of charge that is stored and retrieved is independent of small variations in the ferroelectric capacitors. In practice, ferroelectric capacitors vary from capacitor to capacitor in terms of the maximum amount of charge that can be stored in the ferroelectric capacitor. In general, different ferroelectric capacitors will exhibit hysteresis curves that differ slightly from ferroelectric capacitor to ferroelectric capacitor. In addition, the voltage that must be applied to fully polarize a capacitor in the UP or DOWN direction can vary over the life of the ferroelectric capacitor and with the history of the ferroelectric capacitor. These variations result in $Q_{max}$ being slightly different from ferroelectric capacitor to ferroelectric capacitor and in the voltage that must be applied to expel the stored charge being different from ferroelectric capacitor to ferroelectric capacitor. However, if the charge that is stored is less than the smallest $Q_{max}$ of the ferroelectric capacitors in an array, these differences do not alter the results in embodiments in which the stored data depends on the absolute value of the charge stored. That is, two ferroelectric capacitors that store the same charge can be in different states of polarization as measured by the ratio of the current polarization to the maximum polarization for the capacitor. Similarly, if the voltage used to expel the charge is greater than the highest voltage needed to reset each ferroelectric capacitor in an array, all of the charge will be expelled independent of the variations in the individual ferroelectric capacitors.

Embodiments in which the data stored depends on the state of the polarization of the ferroelectric material or the ratio of the polarization of the current state to the maximum polarization are limited in the number of states that can be stored relative to embodiments that depend only on the absolute value of the stored charge. In such embodiments, each data value corresponds to a corresponding level of polarization. The differences in polarization corresponding to different data values must be greater than the differences in the polarizations that result front ferroelectric capacitor properties that vary from ferroelectric capacitor to ferroelectric capacitor and changes in these properties over time. Hence, the polarization states must be more widely spaced in such embodiments. The extent to which these variations reduce the number of different data values that can be stored in each memory cell depends on the quality of the process that is used in forming the ferroelectric capacitors.

Figure 4:
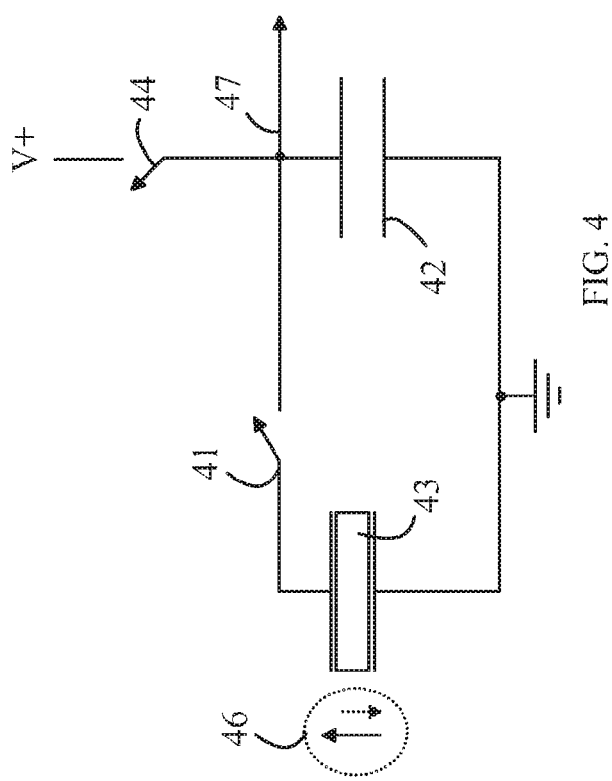
FIG. 4 illustrates a simplified readout circuit based on reading the charge stored on the electrodes.

Refer now to FIG. 4, which illustrates a simplified readout circuit based on reading the charge stored on the electrodes. For the purposes of this discussion, it is assumed that ferroelectric capacitor 43 was reset to an UP polarization as shown by the solid arrow at 46. Data was then stored in ferroelectric capacitor 43 by storing a charge that caused the polarization to decrease in the direction of the dotted arrow. The goal of the readout circuit is to measure that charge when ferroelectric capacitor 43 is again reset to the UP state by providing a readout voltage that is a monotonic function of the stored charge.

The readout operation begins with switch 41 open and switch 44 closed such that capacitor 42 is charged to a potential of V+. After capacitor 42 is charged, switch 44 is opened, and switch 41 is closed. Initially, ferroelectric capacitor 43 will have a potential of V+ across the ferroelectric capacitor. If V+ is sufficiently high, ferroelectric capacitor 43 will be reset to the UP state and the charge, Q, that was stored in ferroelectric capacitor 43 will move to capacitor 42, thereby lowering the potential on capacitor 42 by an amount equal to Q/C, where C is the capacitance of capacitor 42. Hence, the voltage on line 47 will be a function of the charge that was stored on ferroelectric capacitor 43. For this readout scheme to operate over the full range of charges that can be stored on ferroelectric capacitor 43, V+ must be greater than $Q_{max}/C+V_s$ where, $V_s$ is the potential needed to fully reset ferroelectric capacitor 43. It should also be noted that ferroelectric capacitor 43 is reset in the UP state at the end of the readout operation.

Figure 5:
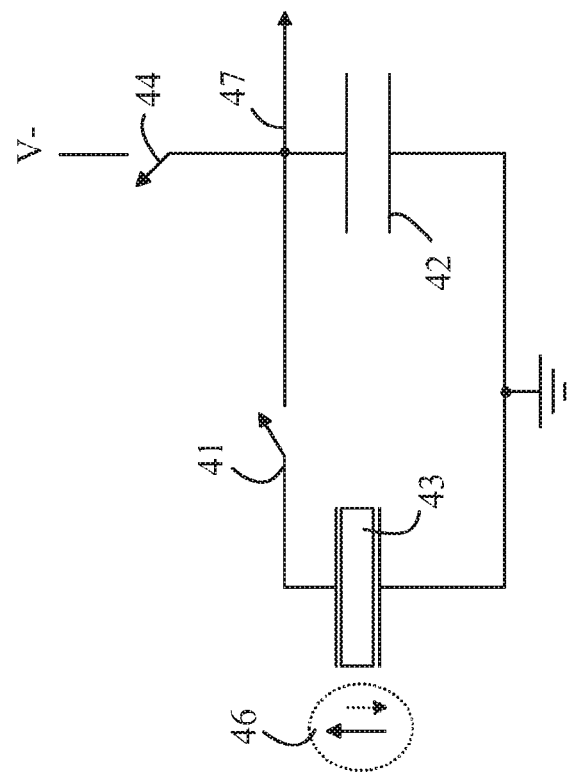
FIG. 5 is a simplified readout circuit according to another embodiment of the present invention.

The circuit shown in FIG. 4 can also be used to implement the second readout scheme if the V+ power supply is replaced by a V− power supply as shown in FIG. 5, which is a simplified readout circuit according to another embodiment of the present invention. This readout circuit operates in a manner analogous to that described above with reference to FIG. 4. First, switch 44 is closed while switch 41 is open to charge capacitor 42. Switch 44 is then opened followed by switch 41 being closed. The potential is sufficient to cause ferroelectric capacitor 43 to become fully polarized in the DOWN direction. The charge needed to accomplish this is provided by capacitor 42. Hence, the difference in voltages on line 47 before and after switch 41 is closed is a measure of the charge needed to move the polarization of ferroelectric capacitor 43 from its partially polarized state to a fully DOWN state. In this scheme, ferroelectric capacitor 43 must then be reset to the UP polarization prior to re-programming.

Figure 6:
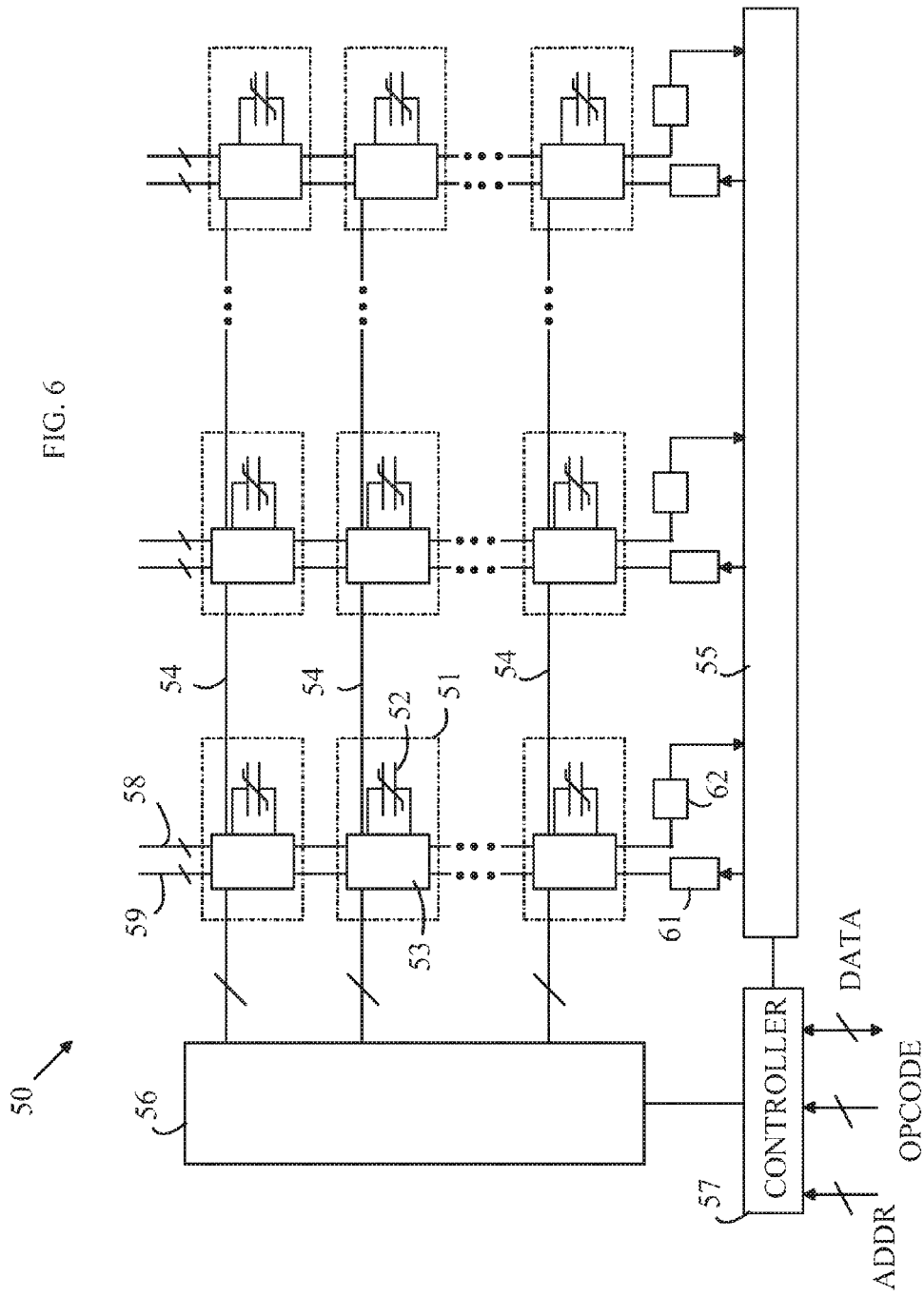
FIG. 6 illustrates one embodiment of an analog ferroelectric memory according to the present invention.

Refer now to FIG. 6, which illustrates one embodiment of an analog ferroelectric memory according to the present invention. Ferroelectric memory 50 is organized as a plurality of ferroelectric memory cells organized into a plurality of rows and columns. A typical ferroelectric memory cell is labeled at 51. Each ferroelectric memory cell includes a ferroelectric capacitor 52 and an interface circuit 53. All of the ferroelectric memory cells in a row are processed in parallel during read and write operations. The row to be processed is selected by a row select circuit 56 that operates a plurality of row select buses 54 that also include conductors for sequencing the row processing operations during reading and writing. Each ferroelectric memory cell in a given column is connected to two column buses shown at 58 and 59. Column bus 58 is used to readout the data stored in the ferroelectric capacitor in the ferroelectric memory cell being processed, and column bus 59 is used to program the ferroelectric capacitor in a new analog value. Each ferroelectric capacitor can be programmed to be in one of N states, where N>2. The state of a ferroelectric capacitor in a row being processed is ascertained by generating a signal on column bus 58 indicative of the amount of charge that was stored in that ferroelectric capacitor. This state is read using circuit 62. The state of a ferroelectric capacitor in a row being processed is set by applying signals to column bus 59 connected to that cell via write circuit 61. The signals cause a predetermined amount of charge that is related to the value to be stored in the ferroelectric memory cell to be stored in the ferroelectric capacitor in that ferroelectric memory cell.

Data that is read out of a row is stored in a row buffer 55. In one aspect of the invention, the data is converted from an analog signal representing the charge stored in the corresponding ferroelectric capacitors to a digital value. Since the readout process is destructive, this data must be restored to the row with a write operation even in cases in which no changes in the data are to be made. If changes are to be made, the changes are entered into row buffer 55 after the ferroelectric memory cells in the row have been reset. The data in row buffer 55 is then converted to a charge that is stored in the corresponding ferroelectric capacitors.

The read and write operations utilize a controller 57 that receives an address (ADDR), operation code (OPCODE), and data to be written to the ferroelectric memory cell(s) specified in the address. Data from the indicated address is output on the data lines. Row select circuit 56 applies the appropriate signals to the row select bus specified by the address.

Ferroelectric memory 50 includes two column buses for each column of memory cells, one for reading and one for writing. This arrangement simplifies the following discussion of the detailed embodiments. However embodiments in which only one column bus is needed can also be constructed.

Refer now to FIG. 7, which illustrates one embodiment of a ferroelectric memory according to the present invention that utilizes the storage scheme discussed above in which data is readout by measuring the amount of charge that was stored in the ferroelectric capacitor during the writing operation. To simplify the discussion, only one ferroelectric memory cell in ferroelectric memory 70 is shown. The four row lines R1-R4 are part of the row bus corresponding to the row of memory cells in which ferroelectric memory cell 310 is located. To simplify the following discussion, it will be assumed that the ferroelectric capacitor has been fully polarized to the UP state prior to the write operation by the previous read operation on the ferroelectric capacitor in question. A value is written into ferroelectric memory cell 310 by placing gate 84 in the conductive state and gate 86 in a non-conductive state. Capacitor 77 is then charged to a potential that will result in a charge having a value corresponding to the data being written being transferred to ferroelectric capacitor 82 when gate 76 is placed in a conducting state by write circuit 75. The translation of the data to the voltage needed to provide the charge in question is performed by write circuit 75. The voltage on capacitor 77 is less than $V_2$, by an amount that depends on the data value to be written. When ferroelectric capacitor 82 is connected to write line 73 through gate 84, the top plate will be at a potential that is less than the bottom plate, which is held at $V_2$, and hence, the write operation reverses part of the polarization created by the reset operation.

Data is readout of ferroelectric memory cell 310 in a two-step process by readout circuit 74 that is connected to read line 72 by gate 88. First, capacitor 83 is charged to $V_1$ while being isolated from ferroelectric capacitor 82 by gate 86. Gate 85 is utilized to connect capacitor 83 to $V_1$. Here, $V_1$ is greater than $V_2$ by an amount that allows the maximum design charge to be transferred to capacitor 83 and still have the top plate of capacitor 83 at a voltage greater than $V_2$. The final voltage on capacitor 83 is amplified by source follower 87 and readout by readout circuit 74 which stores the voltage on a capacitor within readout circuit 74. Next, gate 86 is placed in a conducting state with gate 84 off which applies voltage on capacitor 83 across ferroelectric capacitor 82. This resets ferroelectric capacitor 82 and causes the charge stored in ferroelectric capacitor 82 to be released, which, in turn, lowers the voltage at the gate of source follower 87. This voltage is then read by readout circuit 74 and subtracted from the voltage stored previously to arrive at a voltage difference that is indicative of the charge that was released by ferroelectric capacitor 82. The resultant analog voltage can then be digitized by an analog-to-digital converter within readout circuit 74. As noted above, ferroelectric capacitor 82 is left in the fully polarized UP state at the end of the readout process. If ferroelectric memory cell 310 is being read, the value that was read out must be restored into ferroelectric capacitor 82 by inputting the data out value to write circuit 75 as described above.

Figure 8A:
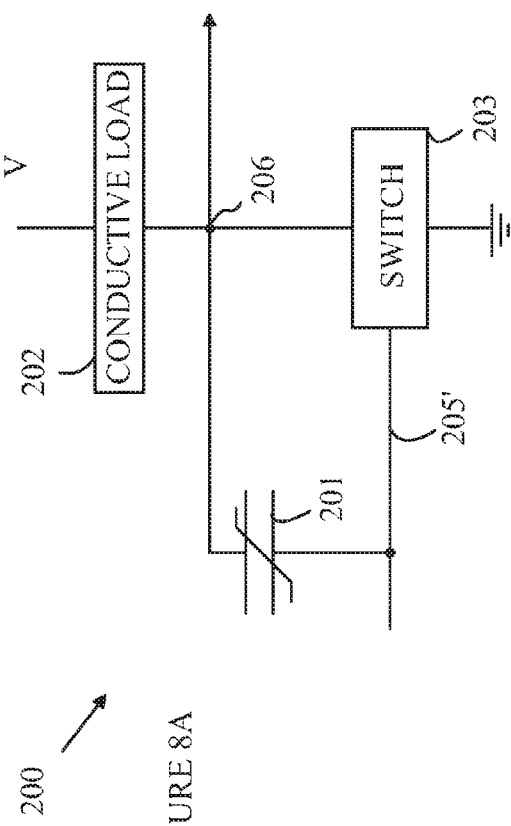
FIG. 8A is a schematic drawing of an autonomous memory circuit.

The ferroelectric memory cell discussed above is one example of a ferroelectric memory cell that could be utilized in the present invention. However, other forms of ferroelectric memory cells could be used. Another embodiment of a ferroelectric memory cell that can be utilized to construct an analog memory is analogous to the autonomous memory circuit described in U.S. Pat. No. 7,990,749. Refer first to FIG. 8A, which is a schematic drawing of an autonomous memory circuit. Autonomous memory circuit 200 includes a ferroelectric capacitor 201 and a switch 203 having a current-actuated control input 205'. That is, the impedance of switch 203 decreases with an increasing current through current-actuated control input 205'. A conductive load 202 is connected between a power rail and switch 203.

Ferroelectric capacitor 201 has a remanent polarization that can be switched by applying a voltage across ferroelectric capacitor 201. That is, in the absence of a voltage across the capacitor, the dielectric of the capacitor is electrically polarized. In a binary memory that stores a single bit, the ferroelectric capacitor is operated such that the dielectric is polarized either fully UP or fully DOWN. If a voltage is applied across the ferroelectric capacitor, an electric field is created in the ferroelectric capacitor. If the field direction is the same as that of the remanent polarization, a small current flows in the circuit connecting the two electrodes of the ferroelectric capacitor. If, on the other hand, the applied electric field is in a direction opposite to that of the remanent polarization, the remanent polarization will change direction to conform to the new field direction, and a large current will flow in the external circuit. The magnitude of the current and the voltage at which it flows can be set by adjusting the composition, area, and thickness of the ferroelectric capacitor.

Switch 203 changes from a high impedance state to a low impedance state when a current enters current-actuated control input 205'. In autonomous memory circuit 200, it is assumed that the potential of the input line to switch 203 remains at or near ground independent of the state of the switch. To simplify the following discussion, it will be assumed that the power rail is positive and that the "UP" remanent polarization state is set when the positive rail potential is applied across the electrodes of ferroelectric capacitor 201. However, other embodiments in which the input is referenced to power and the output is referenced to ground can be utilized.

First, assume that ferroelectric capacitor 201 is polarized in the UP state. When power is turned on, switch 203 is initially in the off state; hence, the potential at node 206 will increase toward V. Thus, the field applied to ferroelectric capacitor 201 will also be in the UP direction, and ferroelectric capacitor 201 will not flip states. Accordingly, little current will flow into the input of switch 203, switch 203 will remain off, and the output of autonomous memory circuit 200 will quickly to the potential of V.

Next, assume that ferroelectric capacitor 201 is polarized in the DOWN state. When power is turned on, the applied electric field across ferroelectric capacitor 201 will be opposite to that of the remanent polarization of ferroelectric capacitor 201, and ferroelectric capacitor 201 will attempt to flip states to match the applied electric field. In this case, a much larger current will flow into the control input of switch 203, and switch 203 will enter the conducting state. Node 206 will rise to an intermediate state that is less than V. The specific potential will depend on the details of the switch and the conductive load. This intermediate state will remain until ferroelectric capacitor 201 finishes switching to its state. At that point there will be no more charge flowing out of ferroelectric capacitor 201, and switch 203 will again enter the non-conducting state. Hence, the potential on node 206 will then increase back to V.

Thus, after power is turned on, autonomous memory circuit 200 will have a temporary output that depends on the state of polarization of ferroelectric capacitor 201 for the period of time needed for ferroelectric capacitor 201 to switch states. If ferroelectric capacitor 201 is UP when power is turned on and does not switch, the output will go high almost immediately. If ferroelectric capacitor 201 is in the DOWN state when power is turned on and does switch, the output will go to the intermediate state characterized by voltage $V_s$ for the temporary period and then will go high. After that temporary time period, the output will always be high, and ferroelectric capacitor 201 will be in the UP polarization state.

Figure 8B:
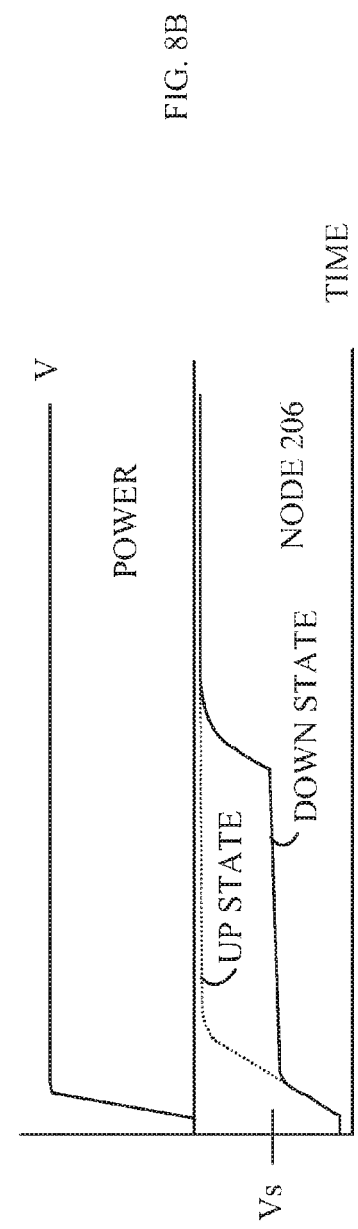
FIG. 8B illustrates the potential on the power rail and on the node shown in FIG. 8A as a function of time when the autonomous memory circuit is powered up with the ferroelectric capacitor in the UP and DOWN states.

Refer now to FIG. 8B, which illustrates the potential on the power rail and on node 206 shown in FIG. 8A as a function of time when autonomous memory circuit 200 is powered up with ferroelectric capacitor 201 in the UP and DOWN states. If ferroelectric capacitor 201 is in the DOWN state when autonomous memory circuit 200 is powered up, the potential on node 206 initially increases with the power rail potential until the potential at node 206 reaches a value that causes ferroelectric capacitor 201 to begin to change polarization state. As ferroelectric capacitor 201 begins to flip polarization, a charge is released that causes switch 203 to begin to conduct. If switch 203 begins to conduct too much, the potential on node 206 begins to drop and ferroelectric capacitor 201 stops switching. If switch 203 does not conduct enough, the potential on node 206 rises faster causing ferroelectric capacitor 201 to switch faster forcing more current into the control input of switch 203 increasing its conductivity. Thus, the circuit stabilizes with the potential of node 206 at a specific intermediate value with a slow rate of rise. In this manner, the change in conductivity of switch 203 limits the voltage rise at node 206 until the change in the state of ferroelectric capacitor 201 is completed. At this point, no further charge will be released from ferroelectric capacitor 201, and hence, switch 203 will again become non-conducting. The potential during the transition of ferroelectric capacitor 201 will be referred to as the "shelf voltage", $V_s$, in the following discussion. The specific shape of the potential at node 206 will, in general, depend on the specific switch implementation.

An analog ferroelectric memory cell having a continuum of states can be constructed from autonomous memory circuit 200. First consider the case in which ferroelectric capacitor 201 is partially polarized. It will be assumed that the polarization of ferroelectric capacitor 201 had been set to the DOWN state, and then a charge indicative of the value that is stored in ferroelectric capacitor 201 is introduced into ferroelectric capacitor 201 such that the polarization state is partially moved toward an UP polarization state. The manner in which this is accomplished will be discussed in more detail below.

When autonomous memory circuit 200 is powered up in this partial polarization state, the voltage at node 206 will again rise to the shelf voltage, $V_s$. However, the length of time at which this voltage remains at the shelf voltage will depend on the degree of partial polarization toward the DOWN state. In particular, the length of the shelf period is a function of the charge stored in ferroelectric capacitor 201. Hence, by measuring the length of the shelf period when the cell is powered up, the data value stored in the ferroelectric capacitor can be determined.

In one aspect of the present invention, the autonomous memory cell is used to store an analog value by resetting the ferroelectric capacitor to the DOWN state and then partially switching the ferroelectric capacitor toward the UP state. The writing operation can be viewed as a reset of the autonomous memory cell from the full DOWN state that is interrupted before the autonomous memory cell is fully reset to the UP state. That is, the writing operation moves the potential along the shelf to a point indicative of the data to be stored. The reading operation measures the time needed to complete the switching to the UP state, and hence, determines the charge needed to complete the reset to the UP state.

In one aspect of the present invention the current passing through conductive load 202 is constant and is split between the current passing through switch 203 and the current that passes into ferroelectric capacitor 201. In such embodiments, the charge stored in the ferroelectric capacitor is proportional to the time over which conductive load 202 is conducting this constant current. Hence, a known charge can be stored in ferroelectric capacitor 201 by setting the time the voltage V is applied to the conductive load. The charge that was previously stored in ferroelectric capacitor 201 can be determined by connecting the conductive load to the voltage source and measuring the time needed for the potential at node 206 to rise to V.

Figure 9A:
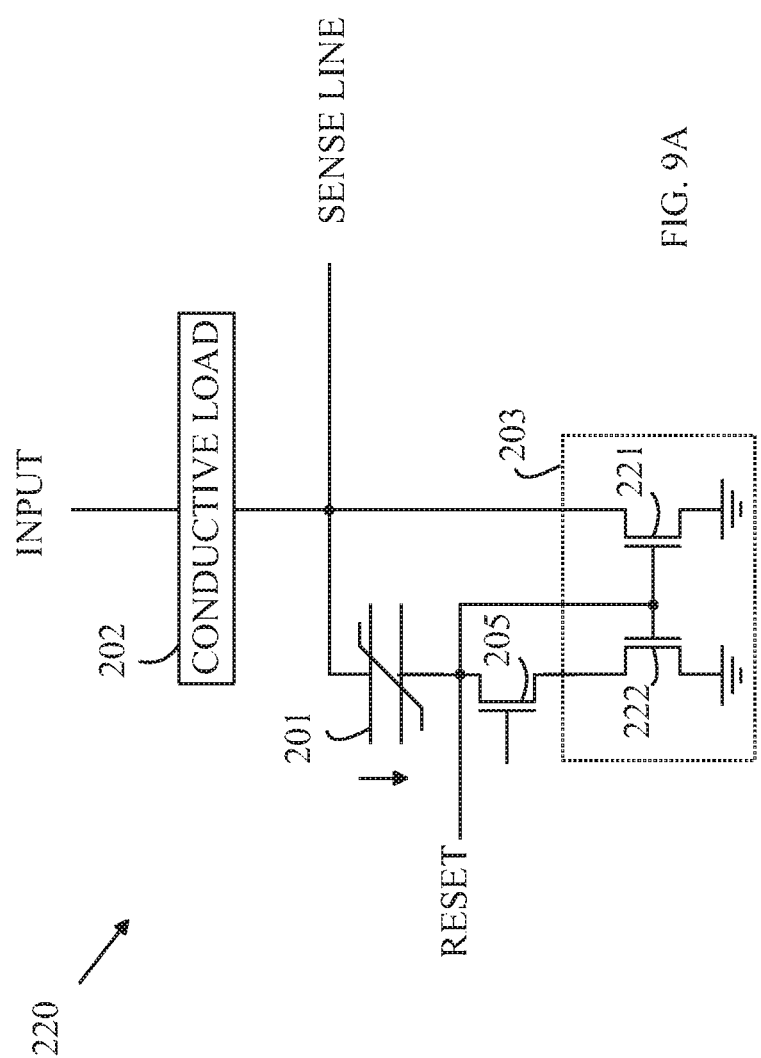
FIG. 9A illustrates a CMOS embodiment of an autonomous memory cell according to one embodiment of the present invention.

It is advantageous to construct an autonomous memory cell such as that outlined in FIG. 8A in a CMOS process using CMOS FET transistors for switch 203. Refer now to FIG. 9A, which illustrates a CMOS embodiment of an autonomous memory cell according to one embodiment of the present invention. In autonomous memory cell 220, switch 203 is implemented as a current mirror consisting of FETs 221 and 222. Hence, the current passing through FET 221 is a set fraction of the current leaving ferroelectric capacitor 201, which passes through FET 222. The ratio of the two currents is determined by the ratio of the widths of the two FETs if the channel lengths are the same. In one exemplary embodiment, FET 222 has a width that is 15 times less than that of FET 221. In this case, FET 221 mirrors 15 times the current forced through FET 222 by ferroelectric capacitor 201. During the resetting of ferroelectric capacitor 201, FET 205 is non-conducting and the RESET voltage turns on FET 221 to provide a path to ground for charge coming from ferroelectric capacitor 201 as it switches to the DOWN state. When data is being written into ferroelectric capacitor 201, FET 205 is in the conducting state so the current flow through FET 222 controls the conductivity of FET 221.

The splitting of the current through the conducting load allows larger currents that are more easily controlled to be used in programming ferroelectric capacitor 201. In some cases, it is advantageous to utilize as small a ferroelectric capacitor as possible. Hence, the various states are separated by small charge differences. Controlling such small differences in charge can present challenges that are avoided by using a much larger charge that is split between ferroelectric capacitor 201 and the branch of the charging circuit that goes through FET 221.

The fraction of the current split between FET 221 and FET 222 will be constant if the voltage drop through FET 205 is small. If the voltage drop is not a percentage of the current flowing through FET 222, it will be a function of the current through conductive load 202. Since the current through conductive load 202 is known by the write circuitry that provides the input, this dependency can be taken into account when setting the duration of the write voltage. Embodiments in which the fraction of the current split between the two paths is constant will be discussed in more detail below. To simplify the following discussion, it will be assumed that the voltage drop through FET 205 can be ignored.

Data is written into ferroelectric capacitor 201 by pulsing the input line for a length of time that is determined by the data value that is to be written into ferroelectric capacitor 201. The goal of the pulse is to store a known quantity of charge in ferroelectric capacitor 201, the quantity depending on the data value that is to be written. The current mirror ensures that a known fraction of the current flowing through conductive load 202 is diverted into ferroelectric capacitor 201. Hence, to inject a desired quantity of charge into ferroelectric capacitor 201, the average current through conductive load 202 must be known. The charge stored is then given by the time span of the input pulse times the average current through conductive load 202 times the fraction of the current that passes through FET 222.

In one exemplary embodiment, conductive load 202 is a constant current source. In this case, the current is both constant and known, and hence, the pulse width determines the charge that is stored.

In another exemplary embodiment, conductive load 202 is a resistor. In this case, the potential drop across the resistor determines the current that flows into ferroelectric capacitor 201. However, it should be noted that the potential drop across conductive load 202 is the difference between the voltage at the input and the shelf voltage exhibited by ferroelectric capacitor 201. Since the shelf voltage varies as a function of the charge stored in ferroelectric capacitor 201, the pulse length only approximately determines the charge stored in ferroelectric capacitor 201. A more precise charge measurement can be utilized by varying the input voltage such that the potential difference across conductive load 202 remains at a predetermined value so that the current through conductive load 202 remains constant over the pulse. In this case, the pulse width will again determine the charge that is stored in ferroelectric capacitor 201.

An alternative method for measuring the charge that enters ferroelectric capacitor 201 is to measure the potential difference between the input voltage and the sense line as a function of time and terminating the input signal when the integral of that difference reaches a predetermined value that depends on the charge to be written.

It should be noted that the above-described embodiments all operate by inserting a predetermined charge into ferroelectric capacitor 201, the predetermined charge being determined by the data value that is to be stored in ferroelectric capacitor 201. As noted above, the hysteresis curve for ferroelectric capacitor 201 can vary over time and is different from ferroelectric capacitor to ferroelectric capacitor in an array of ferroelectric capacitors. By inserting a predetermined charge, the problems associated with these variations are substantially reduced. In contrast, programming a ferroelectric capacitor to an intermediate polarization state by applying a voltage across the ferroelectric capacitor in which the voltage is determined by the charge does not insert a known charge into the ferroelectric capacitor, since the amount of charge that is stored will depend on the particular ferroelectric capacitor and the history of prior storage and reset events.

Prior to storing charge in ferroelectric capacitor 201, ferroelectric capacitor 201 must be reset to be fully polarized in the direction opposite to the direction in which the input signal attempts to polarize the ferroelectric capacitor. For the purpose of the present discussion, it will be assumed that the input signal is positive and that ferroelectric capacitor 201 is initially polarized in the direction shown by the arrow in FIG. 9A. To reset ferroelectric capacitor 201 in this direction a voltage that is greater than or equal to the saturation voltage of the ferroelectric capacitor must be applied across ferroelectric capacitor 201 from the RESET node. If the saturation voltage is less than the voltage at which FET 222 conducts, which is typically about 0.7 volts, the reset circuit shown in FIG. 9A will accomplish the reset without FET 205. A positive pulse on the reset line together with the sense line being held at ground will reset ferroelectric capacitor 201 as shown.

The charge that is stored in ferroelectric capacitor 201 can be determined by two different methods. The first measures the charge needed to fully polarize ferroelectric capacitor 201 in a direction opposite to the polarization set in the reset operation. As noted above, the voltage on the sense line will return to the input voltage when ferroelectric capacitor 201 is fully polarized in the direction opposite to that shown in FIG. 9A. In this case, ferroelectric capacitor 201 will have stored a charge equal to $Q_{max}$. Hence, by measuring the charge needed to cause the voltage on the sense line to reach the input voltage and knowing $Q_{max}$, the charge that was stored in ferroelectric capacitor 201 can be determined. While this method of reading the charge stored in ferroelectric capacitor 201, and hence, the data value stored in ferroelectric capacitor 201 will work, it relies on a knowledge of $Q_{max}$. However, as pointed out above, $Q_{max}$ will vary from ferroelectric capacitor to ferroelectric capacitor. In addition, $Q_{max}$ will vary over the life of ferroelectric capacitor 201. Hence, this method is not preferred.

Figure 9B:
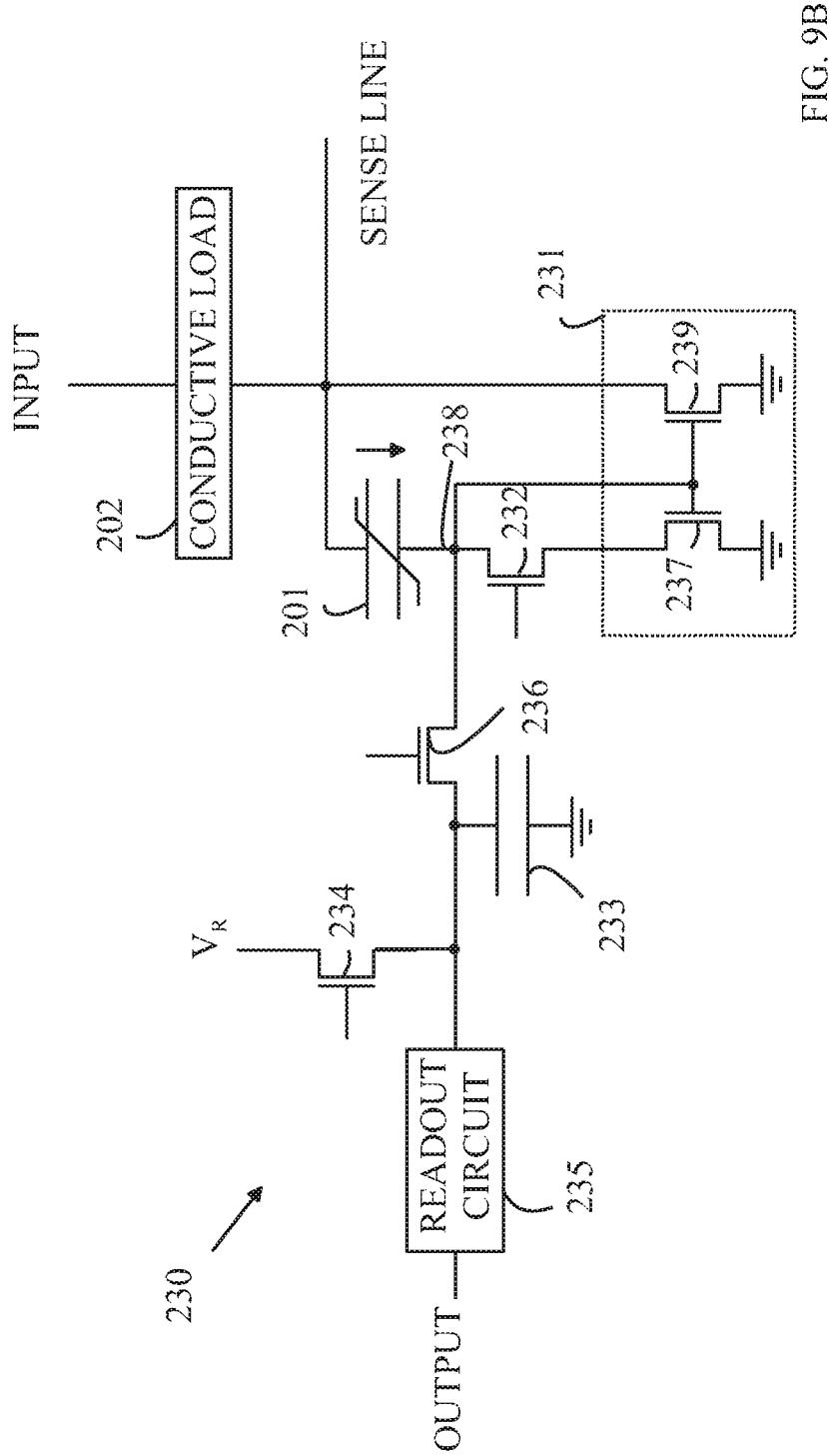
FIG. 9B illustrates a CMOS embodiment of an autonomous bit memory according to another embodiment of the present invention.

Refer now to FIG. 9B, which illustrates a CMOS embodiment of an autonomous bit memory according to another embodiment of the present invention. To simplify the drawing, only one memory cell is shown. Autonomous bit memory 230 is written in a manner analogous to that described above with reference to autonomous memory cell 220. FETs 237 and 239 form the current mirror when gate 232 is conducting. Autonomous bit memory 230 is first reset such that ferroelectric capacitor 201 is fully polarized in the direction shown by the arrow, which will be referred to as the DOWN direction in the present discussion. A data value that is to be written into autonomous bit memory 230 is converted to a charge that is to be stored in ferroelectric capacitor 201 and that charge is forced into ferroelectric capacitor 201 by applying a voltage to conductive load 202 in a manner analogous to that described above. The charge in question tends to polarize ferroelectric capacitor 201 in a direction opposite to the DOWN direction. During a write operation, gate 232 is in the conducting state, and hence current mirror 231 operates in a manner analogous to that described above with reference to FIG. 9A. Gate 236 is held in a non-conducting state during the write operation.

It should be noted that autonomous bit memory 230 can be operated as an accumulator. Multiple write operations can be carried out after ferroelectric capacitor 201 is reset. At each write, a data value that is to be added to a sum of data values is converted to a charge that is added to the charge already stored on ferroelectric capacitor 201. Hence, the charge stored on ferroelectric capacitor 201 represents the sum of the various data values written.

The charge that has been stored in ferroelectric capacitor 201 after ferroelectric capacitor 201 was reset can be readout at the same time ferroelectric capacitor 201 is reset to the fully DOWN polarization. The readout operation is preferably executed in two steps. In the first step, capacitor 233 is charged to a reset voltage $V_R$ by placing gate 234 in the conducting state for a short period of time while gate 236 remains in the non-conducting state. The actual potential on capacitor 233 at the end of the charging cycle after gate 234 is returned to the non-conducting state is read by readout circuit 235. Next, gate 232 is placed in a non-conducting state and gate 236 is switched to a conducting state thereby connecting capacitor 233 to ferroelectric capacitor 201. Gate 232 is placed in the non-conducting state during the readout operation. Hence, the potential on node 238 will rise initially to $V_R$ which is sufficient to cause FET 239 to conduct. Accordingly, a potential is applied across ferroelectric capacitor 201. The potential is sufficient to fully polarize ferroelectric capacitor 201 in the DOWN direction. As a result, the charge stored on ferroelectric capacitor 201 is forced off of ferroelectric capacitor 201 and flows through FET 239 to ground. A counter balancing charge must then flow from capacitor 233 onto the opposite plate of ferroelectric capacitor 201. Since capacitor 233 is isolated from any circuit path, this compensating charge results in a decrease in the voltage across capacitor 233. Readout circuit 235 measures the voltage on capacitor 233 after the reset operation and subtracts that voltage from the previously measured value to determine the amount of charge that left ferroelectric capacitor 201.

The readout operation will also fully reset ferroelectric capacitor 201 provided $V_R$ is greater than $V_c+Q_{max}/C$, where $V_c$ is the saturation voltage of ferroelectric capacitor 201, and C is the capacitance of capacitor 233. That is, $V_R$ must be sufficient to ensure that ferroelectric capacitor 201 is subjected to the saturation voltage after all of the charge needed to reset ferroelectric capacitor 201 has been removed from capacitor 233.

It should be noted that capacitor 233 is preferably small. If capacitor 233 is large, the change in voltage during the readout operation will be too small to easily measure. On the other hand, capacitor 233 must be large enough to supply $Q_{max}$ and still be at a voltage that is greater than or equal to the saturation voltage of ferroelectric capacitor 201. While capacitor 233 is shown as a discrete circuit element, it should be noted that capacitor 233 can be the parasitic capacitance of an FET or other circuit element in readout circuit 235.

Figure 10:
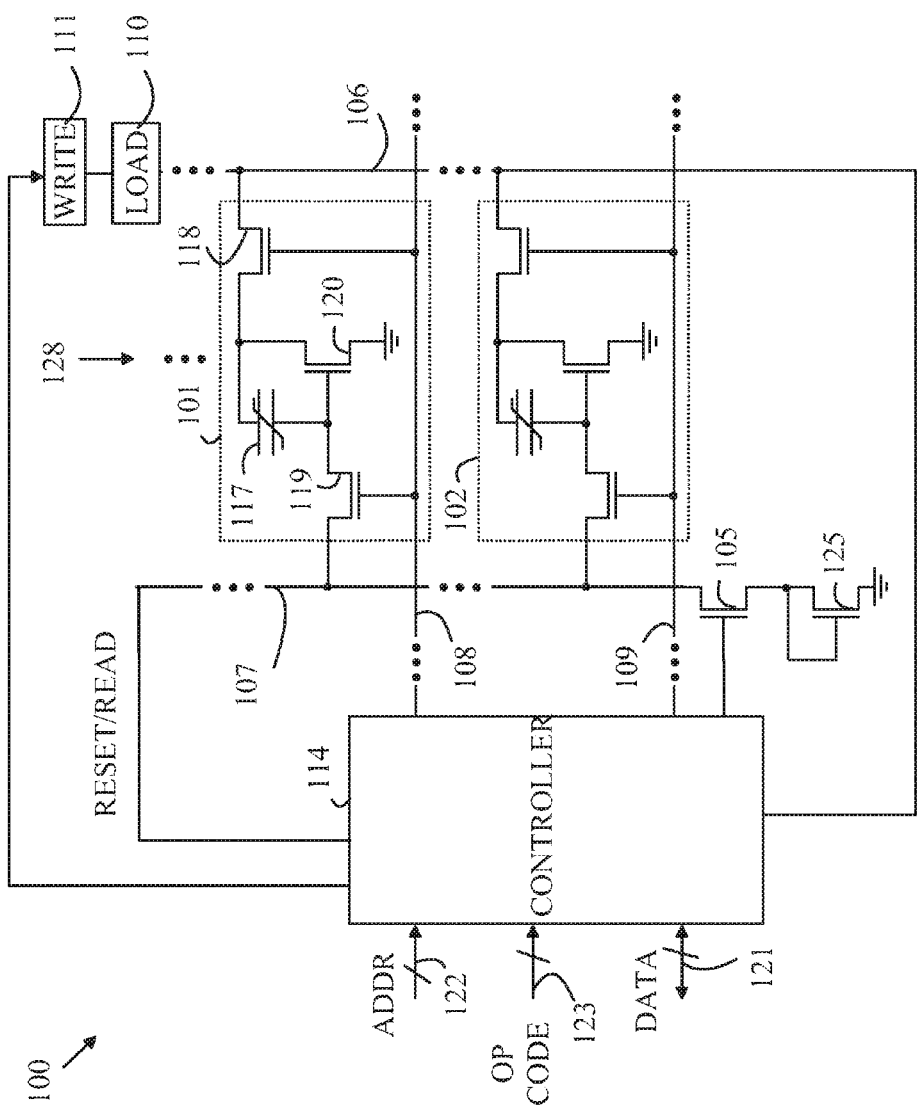
FIG. 10 illustrates another embodiment of a multi-state ferroelectric memory according to the present invention.

Refer now to FIG. 10, which illustrates another embodiment of a multi-state ferroelectric memory according to the present invention. Ferroelectric memory 100 includes a plurality of rows and columns of ferroelectric memory cells of which ferroelectric memory cells 101 and 102 are typical. To simplify the drawing, only column 128 is shown. The ferroelectric memory cells in each column are connected to a read line and a write line. The read and write lines corresponding to column 128 are shown at 107 and 106, respectively. The read/write operations of ferroelectric memory 100 are controlled by controller 114, which receives an address on ADDR bus 122, an operation code on bus 123, and either data to be written into ferroelectric memory 100 or outputs data read from the address in question on bus 121.

Each ferroelectric memory cell includes a ferroelectric capacitor such as ferroelectric capacitor 117 and three CMOS FETs, such as FETs 118, 119, and 120. FETs 118 and 119 act as gates for connecting the ferroelectric memory cell to the read and write lines in response to a signal on a row select line. Typical row select lines are shown at 108 and 109. FETs 120 and 125 provide the current mirror discussed above. FET 125 is shared by all of the memory cells in the column to reduce the area of the array. It should be noted that FET 125 is only used during the writing operation and during that operation only one memory cell in a column is connected to reset/read line 107. This aspect of the invention saves a significant amount of space relative to embodiments that have a complete current mirror in each cell. Similarly, all of the ferroelectric memory cells in column 128 share a common load 110.

Data is written into the currently-selected ferroelectric memory cell by first resetting the corresponding ferroelectric capacitor to the DOWN state and then partially resetting that ferroelectric capacitor in the UP direction by metering an amount of charge that depends on the data value being stored into the ferroelectric capacitor. The following discussion uses only positive voltages; however, embodiments that utilize negative voltages can also be constructed. The specific ferroelectric memory cell that is to be selected is determined by controller 114 from the value on the ADDR bus 122. The value to be written is received on bus 121.

Controller 114 resets the ferroelectric memory cell by setting the potential on reset/read line 107 to V with FET 105 in the non-conducting state. This causes FET 120 in the selected memory cell to conduct any current displaced from the ferroelectric capacitor to ground. Hence, a potential of V is applied to the ferroelectric capacitor in a direction that polarizes the ferroelectric capacitor in the DOWN state. V is chosen such that the ferroelectric capacitor is completely polarized in the DOWN state.

After the ferroelectric capacitor has been polarized in the DOWN state, reset/read line 107 is disconnected from controller 114 and FET 105 is placed in the conducting state. The data that is to be input to the ferroelectric capacitor is input in digital form and then converted to a time value that represents the time switch write circuit 111 is to apply the write voltage to load 110, and hence, meter charge onto the ferroelectric capacitor that is connected to lines 106 and 107 in a manner analogous to that discussed above. As noted above, each memory cell can also be used as an accumulator by writing data multiple times into the ferroelectric capacitor without resetting the ferroelectric capacitor between the write operations.

Data can be read from the currently selected ferroelectric memory cell by either of the two methods discussed above. To simplify the drawing, the read circuitry is included in controller 114. If data is to be read by determining the amount of charge needed to polarize the ferroelectric capacitor in the UP direction, write circuit 111 applies the same write potential as used in inputting charge to the ferroelectric capacitor and the time for line 106 to reach that potential is measured by controller 114.

Alternatively, controller 114 can include the read circuitry discussed above with respect to FIG. 9B. In this embodiment, FET 105 is placed in a non-conducting state and the charge stored in the ferroelectric capacitor is measured by determining the decrease in potential on a precharged capacitor in the manner described above with respect to FIG. 9B.

In the embodiment shown in FIG. 10, the write operation is performed by metering a charge onto the ferroelectric capacitor by interrupting a reset operation after a period of time that depends on the value being written. However, other methods for metering the charge onto the ferroelectric capacitor could be utilized. For example, the charge metering scheme discussed above with reference to FIG. 7 could also be utilized.

Figure 11:
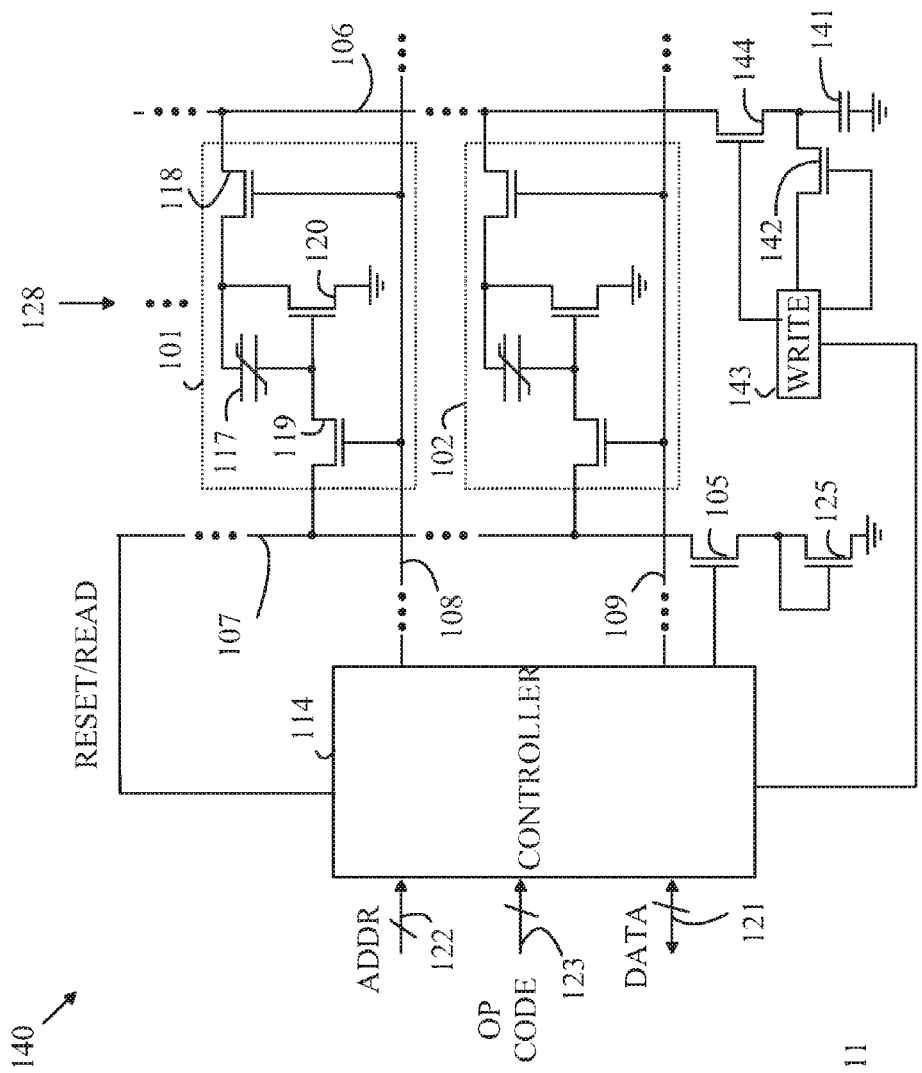
FIG. 11 illustrates a ferroelectric memory according to another embodiment of the present invention.

Refer now to FIG. 11, which illustrates a ferroelectric memory according to another embodiment of the present invention. Ferroelectric memory 140 utilizes a fixed charge transfer to write to the ferroelectric capacitors. To simplify the following discussion, those elements of ferroelectric memory 140 that serve functions analogous to elements in ferroelectric memory 100 have been given the same numerical designations. Data is written into the ferroelectric capacitor in the selected ferroelectric memory cell by first resetting the ferroelectric capacitor in the DOWN state in the same manner as described for ferroelectric memory 100. Data is then written by partially polarizing the ferroelectric capacitor toward the UP state. The data to be written is first converted to a charge that is applied to capacitor 141 by write circuit 143, which charges capacitor 141 to a voltage that depends on the data value to be transferred. The charge is loaded into capacitor 141 by placing FET 142 in the conducting state while maintaining FET 144 in the non-conducting state. After capacitor 141 has been suitably charged, FET 142 is placed in the non-conducting state and FET 144 is placed in the conducting state to transfer the charge to the memory cell that is currently selected. During the charge transfer, FET 105 is placed in the conducting state. Hence, the fraction of the charge that is forced onto the ferroelectric capacitor is determined by the ratio of the areas of FETs 120 and 125. The charge stored in a ferroelectric capacitor is preferably determined by the second method discussed above with respect to the embodiments shown in FIG. 10.

The use of the current mirror in this embodiment is optional. If the reset/read line is held at ground during the charge transfer, then FETs 105 and 125 can be omitted from the circuit. In such an embodiment, all of the charge will be forced onto the ferroelectric capacitor.

The above-described embodiments of the present invention assume that a ferroelectric capacitor is purely a charge storage device. In practice, a ferroelectric capacitor can be viewed as a charge storage device in parallel with a capacitor that stores charge that is not associated with the electric field created by the remanent polarization of the ferroelectric material. In the following discussion, this capacitance will be referred to as the non-remanent polarization capacitance, and the associated capacitor will be referred to as the non-ferroelectric capacitor. The term ferroelectric capacitor will continue to be used for the device in which charge is stored in response to the remanent polarization of the ferroelectric material in the device. As the potential on the ferroelectric capacitor is switched, charge is stored on, or removed from, the storage element and the associated non-ferroelectric capacitor. For the purposes of this application, the charge that is stored in the storage device associated with the ferroelectric capacitor will be referred to as the "charge stored in the ferroelectric capacitor".

Figure 12:
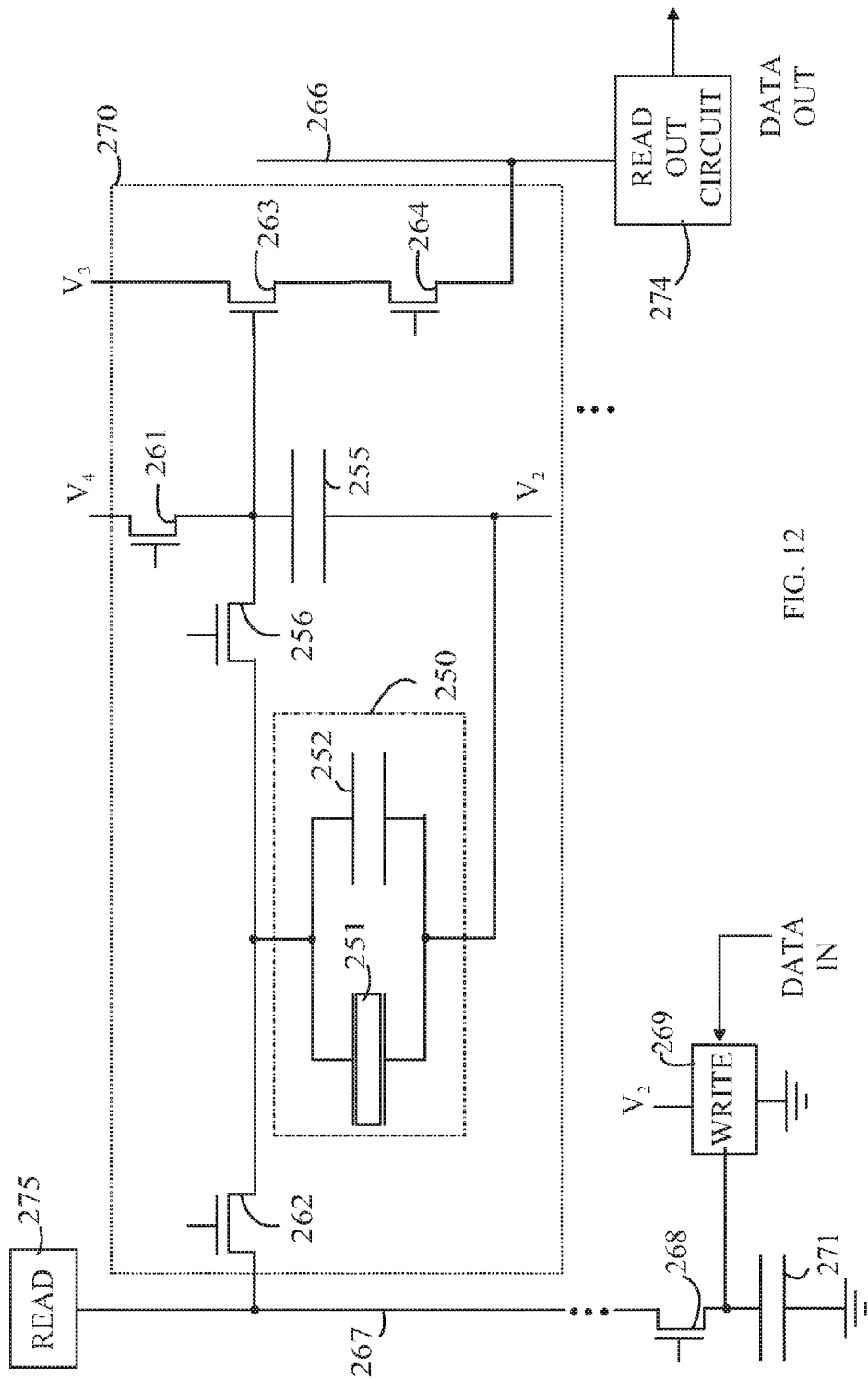
FIG. 12 illustrates another embodiment of a ferroelectric memory according to the present invention.

If the charge moved to/from the associated non-ferroelectric capacitor is small compared to the charge that is moved to/from the storage device, the associated non-ferroelectric capacitor can be ignored. However, embodiments that take into account the associated non-ferroelectric capacitor of the ferroelectric capacitor can provide improved resolution thereby allowing embodiments having increased numbers of states to be constructed. Refer to FIG. 12, which illustrates another embodiment of a ferroelectric memory according to the present invention. To simplify the drawing, only one ferroelectric memory cell is shown. Ferroelectric memory cell 270 is similar to ferroelectric memory cell 310 shown in FIG. 7; however, the manner in which the ferroelectric memory cell is readout has been altered to take into account the associated non-ferroelectric capacitor 252 in the ferroelectric capacitor shown at 250. The charge storage component is shown at 251.

First, consider the manner in which data is written into storage device 251 in the presence of non-ferroelectric capacitor 252. The goals of the write circuitry and procedure are to store a charge Q in storage device 251, where Q is determined by the data to be stored. A first approximation to Q can be stored in the combination of storage device 251 and associated non-ferroelectric capacitor 252 by charging capacitor 271 to a predetermined voltage that depends on Q and then placing gate 268 in the conducting state while holding gate 262 in the non-conducting state. The potential on write line 267 is then read and recorded by read circuit 275; denote this potential by $P_1$. Gate 262 is then placed in the conducting state, and the potential on write line 267 is read a second time. Denote the second potential by $P_2$. The charge that entered ferroelectric capacitor 250 is given by $|P_1-P_2|/C_{271}$, where $C_{271}$ is the capacitance of capacitor 271. This charge is stored either on associated non-ferroelectric capacitor 252 or in storage device 251. The charge that is stored in associated non-ferroelectric capacitor 252 is given by $|P_2-V_2|/C_{252}$, where $C_{252}$ is the capacitance of associated non-ferroelectric capacitor 252. If $C_{252}$ is known from the design parameters of the ferroelectric memory, then this charge, and hence the charge stored on storage device 251 as a result of the write operation is known. If the charge stored on storage device 251 is not equal to the charge corresponding to the data value that is to be stored, a second write operation that utilizes a different $P_1$ can be performed to force an additional increment of charge onto storage device 251, and the procedure repeated until the desired amount of charge has been stored on storage device 251.

The above-described write procedure assumes that the value of associated non-ferroelectric capacitor 252 is known to sufficient accuracy. It should be noted that this value could vary slightly from ferroelectric capacitor to ferroelectric capacitor in the memory. Accordingly, a procedure that determines the $C_{252}$ during the write procedure could be required. In one aspect of the present invention, $C_{252}$ is determined as follows: It is assumed that storage device 251 is fully saturated in the DOWN state, and that the potential across ferroelectric capacitor 250 is set to zero by connecting write line 267 to $V_2$ through write circuit 269. Ferroelectric capacitor 250 is then isolated from write line 267. Hence, at the start of the procedure, there is no charge on non-ferroelectric capacitor 252, and no further charge can be loaded onto storage device 251 by a potential difference caused by a potential on write line 267 that is less than $V_2$.

First, capacitor 271 is charged to $P_2$, which is less than $V_2$ with gate 268 in the non-conducting state. After being so charged capacitor 271 is isolated front write circuit 269 by a gate that is internal to that write circuit, and gate 268 is placed in the conducting state while gate 262 remains non-conducting. The potential on write line 267 will be $P_2$ or a value very close to that value. Read circuit 275 measures that potential, and then gate 262 is placed in the conducting state. Since the potential across storage device 251 cannot force additional charge into, or out of, storage device 251, only the charge on non-ferroelectric capacitor 252 can move. Any charge that moves will be the result of the voltage difference across associated non-ferroelectric capacitor 252 between the final potential $P_3$ and $P_2$. The charge that moves is stored on capacitor 271. Denote the potential on write line 267 after gate 262 is put in the conducting state by $P_3$. Then the charge that moved is $Q_m=|P2-P_3|/C_{271}$. Hence, $C_{252}=Q_m/|P_2-P_3|$. Accordingly, the write circuitry can compensate for variations in associated non-ferroelectric capacitor 252 from ferroelectric capacitor to ferroelectric capacitor.

At the end of a write operation, any charge that is stored on associated non-ferroelectric capacitor 252 is removed by setting the potential on write line 267 to $V_2$ utilizing write circuit 269 and connecting ferroelectric capacitor 250 to write line 267. This removes any potential difference across non-ferroelectric capacitor 252 and storage device 251. The charge in storage device 251 is not altered by this operation. However, any charge that is left in non-ferroelectric capacitor 252 is removed.

A read operation can be accomplished in an analogous manner. The read operation starts in a manner analogous to that described above. While ferroelectric capacitor 250 is isolated from capacitor 255, capacitor 255 is charged to a first potential, $V_4$ utilizing gate 261. The actual value of the potential on capacitor 255 is readout by readout circuit 274 through source follower 263 and gate 264 and stored as $P_5$ that couples the potential onto read line 266. This potential is stored in readout circuit 274. Next, gate 256 is placed in the conducting state. The potential $V_4$ is set such that $V_4-V_2$ is above the potential that will reset ferroelectric capacitor 250 to the fully polarized UP state. Hence, any charge that is stored on storage device 251 is ejected from storage device 251 and moves to non-ferroelectric capacitor 252 and capacitor 255, which are now connected in parallel. The voltage at the gate of source follower 263 is then readout again. Denote this voltage by $P_6$, the charge that was stored on storage device $Q=|P_5-P_6|/(C_{252}+C_{255})$. If $C_{252}$ is known, the readout is complete, except for digitizing the result.

If $C_{252}$ is not known, it can be determined in a manner analogous to that described above. For example, $V_4$ can be increased to a potential $P_6$, that is above $P_5$ and capacitor 255 is then charged to $P_6$ while associated non-ferroelectric capacitor 252 is isolated from capacitor 255. The potential across capacitor 255 is set to zero by setting write line 267 to $V_2$. Hence, when gate 256 is set to the conducting state, charge will flow from capacitor 255 to associated non-ferroelectric capacitor 252, resulting in the potential at capacitor 255 decreasing. The relative sizes of capacitor 255 and non-ferroelectric capacitor 252 can then be determined from the amount of this potential decrease, and hence, the charge measured from ferroelectric memory cell 270 by readout circuit 274 can be corrected for the associated non-ferroelectric capacitance in ferroelectric capacitor 250.

It should be noted that there are other methods for determining the non-remanent polarization. For example, consider a read operation in which the charge that is stored in the ferroelectric capacitor is determined by resetting the state of the ferroelectric capacitor to the original state of polarization and measuring the charge that leaves the ferroelectric capacitor. If the read operation is performed twice, the first read will measure the charge associated with the sum of the remanent and non-remanent polarizations. The first read operation will leave the ferroelectric capacitor in the saturated state. Hence, there will be no remanent charge to remove in this state. Accordingly, the second read operation will read the non-remanent charge. The difference between the two read results is the remanent charge that was stored in the ferroelectric capacitor.

The above-described embodiments of the present invention are directed to digital memories in which each ferroelectric memory cell stores and retrieves a digital value. However, embodiments in which an analog value is stored and retrieved can also be constructed. In such embodiments, the write circuit receives an analog value rather than a digital value that is converted to a charge that is stored on the ferroelectric capacitor. The read circuit then outputs the analog value representing the charge that was stored on the ferroelectric capacitor.

The above-described embodiments utilize a scheme in which the ferroelectric capacitor is reset to a known state, written once, and then read. However, embodiments in which the ferroelectric capacitor is written multiple times after being reset can also be constructed. Such embodiments provide an "accumulator" function. For example, a ferroelectric capacitor is first reset to the DOWN state and then a first charge $Q_1$ is transferred to the ferroelectric capacitor that moves the polarization toward the UP state. Some time later, a second charge $Q_2$ is transferred to the ferroelectric capacitor that moves the ferroelectric capacitor further toward the UP state, and so on. When the ferroelectric capacitor is finally read, the output will be equal to the sum of the Q values. Hence, the ferroelectric capacitor will have acted as an analog summing circuit.

A known polarization state can be obtained by resetting the ferroelectric capacitor to the UP state and then transferring a known charge that moves the polarization toward the DOWN state for the circuit in FIG. 12 and the autonomous memory circuit of FIG. 9B.

It should be noted that a more general accumulation function could be constructed by resetting the ferroelectric capacitor to a state that is between the UP and DOWN states. This can be accomplished by resetting the ferroelectric capacitor to the DOWN state and then storing a known charge that tends to move the ferroelectric capacitor toward the UP state. Charges can now be transferred to the ferroelectric capacitor that moves the polarization either toward the UP state or the DOWN state by setting both the magnitude of the charge and the polarity of the charging voltage. For example, the digital-to-analog converter shown at 32 in FIG. 3 could be configured to charge capacitor 33 either with a positive potential or a negative potential. When the ferroelectric capacitor is finally read, the result will be the sum of the charges that were stored provided the total stored charge at each intermediate state did not exceed $Q_{max}$.

In a subset of the multiple write embodiments, each write moves a fixed charge to the ferroelectric capacitor. In this case, the value finally written to the ferroelectric capacitor is just the sum of the pulses. This mode can be used to program the ferroelectric capacitor by using a digital data value that is to be stored to set the number of pulses.

In the above-described embodiments, the write circuit is part of the memory. However, embodiments in which the write circuit is outside of the memory could also be constructed. The amount of power needed to force a charge onto the ferroelectric capacitor is small. Consider the case in which the memory cell has a single memory cell. Refer again to FIG. 3. The write circuit includes digital-to-analog converter 32 and capacitor 33 and switch 36. If ferroelectric capacitor 31 is the only ferroelectric capacitor that is "exposed" to this write circuit, the power stored in capacitor 33 is sufficient to write the state or add additional charge to that already stored in ferroelectric capacitor 31. In this sense, the rest of the circuitry that includes ferroelectric capacitor 31 does not need to be powered during the write or accumulation functions described above. In memories that have only one ferroelectric capacitor exposing this capacitor for external write is easily accomplished. For example, refer again to FIG. 7. If ferroelectric memory cell 310 is the only memory cell in the memory, gates 84 and 88 could be omitted. If write circuit 75 can provide both negative and positive voltage levels, $V_2$ can be set to ground. The state of ferroelectric capacitor 82 can then be set by connecting an external write circuit to line 73. To read the state of ferroelectric capacitor 82, ferroelectric memory cell 310 would be connected to a readout circuit on line 72 and the circuitry needed to read the charge released from ferroelectric capacitor 82 when ferroelectric capacitor 82 is reset. In memories having a plurality of such ferroelectric capacitors, the addressing circuitry must also be configured to be powered from the external write circuit.

In the above-described embodiments, the ferroelectric capacitor is programmed by setting a charge that is transferred to the ferroelectric capacitor after the ferroelectric capacitor has been set to a known starting state. Refer again to FIGS. 8A and 8B. In this embodiment of ferroelectric capacitor memory cell, the data is stored by interrupting the "flip" of the state from DOWN to UP. In the above-described embodiments this is accomplished by limiting the charge transfer or using some form of timer to stop the process when the desired point is reached. It should be noted that the shelf voltage region is actually characterized by a shelf voltage that increases with time. The slope of this shelf voltage region depends on the particular ferroelectric capacitor being utilized. If the voltage, V, shown in FIG. 8A is set to a value that is reached during the shelf region, the flipping process will not be completed. Instead, the ferroelectric capacitor will be held at the partially polarized state characterized by V. Accordingly, the state of the ferroelectric capacitor could be set by fully polarizing the ferroelectric capacitor in the DOWN state and then applying a voltage V that is determined by the data to be stored.

Figure 13A:
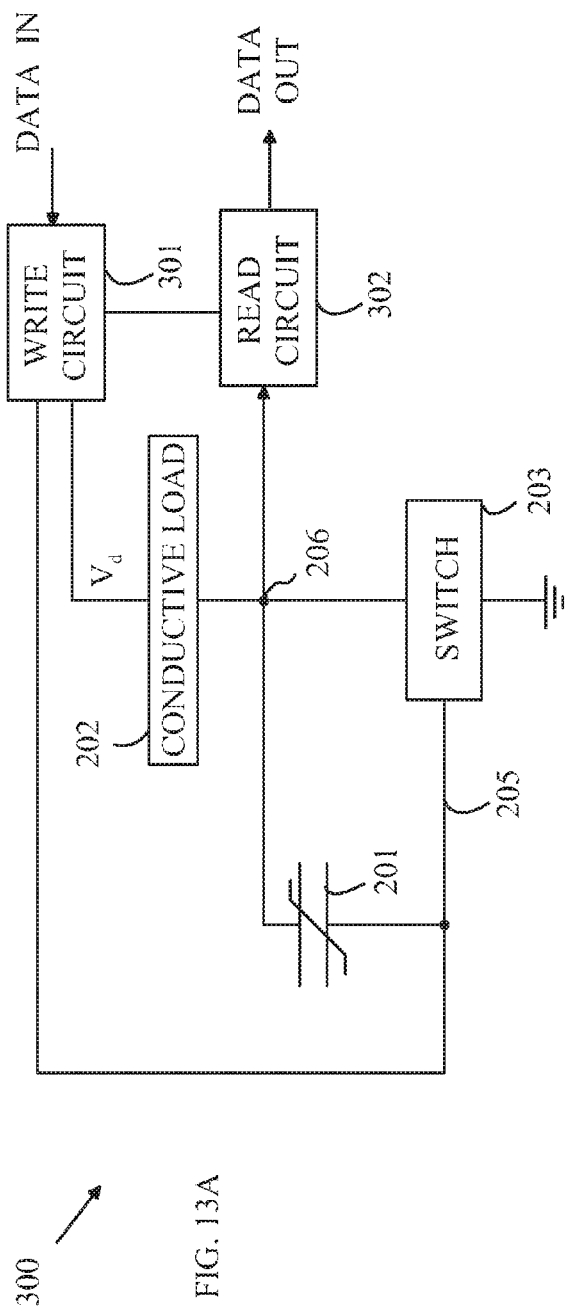
FIG. 13A illustrates another embodiment of a write circuit that can be utilized to set the state of polarization of the ferroelectric capacitor.
Figure 13B:
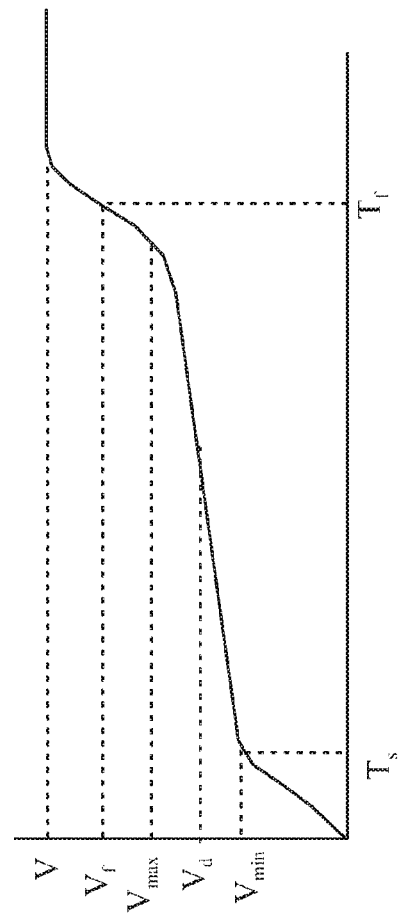
FIG. 13B illustrates data that is written to a ferroelectric capacitor by converting the input data to a voltage $V_d$ that is between the minimum and maximum shelf voltages, $V_{min}$ and $V_{max}$.

Refer now to FIG. 13A, which illustrates another embodiment of a write circuit that can be utilized to set the state of polarization of the ferroelectric capacitor. Ferroelectric memory cell 300 is similar to the memory cell discussed above with reference to FIG. 8A, and hence, elements that serve the same functions as elements discussed with respect to FIG. 8A have been given the same numerical designations. In ferroelectric memory cell 300, conductive load 202 is connected to a write circuit 301 that determines the potential that is applied to ferroelectric capacitor 201. In addition, write circuit 301 sets the potential on current-actuated control input 205'. Prior to writing data into ferroelectric capacitor 201, write circuit 301 applies a potential difference, V, across ferroelectric capacitor 201 that resets ferroelectric capacitor to the DOWN state. Data is then written to ferroelectric capacitor 201 by converting the input data to a voltage $V_d$ that is between the minimum and maximum shelf voltages, $V_{min}$ and $V_{max}$, as shown in FIG. 13B. This potential is applied to conductive load 202 as shown in FIG. 13A. Once node 206 reaches $V_d$, no further charge will be transferred into ferroelectric capacitor 201, and hence, the write operation will terminate leaving ferroelectric capacitor 201 in the desired state.

A similar strategy can be used to construct a non-destructive read operation. When power is applied to the programmed ferroelectric capacitor by setting the potential at the conductive load to a value that is greater than the shelf voltage at which the ferroelectric capacitor was programmed, the voltage at node 206 rises to the shelf voltage that was present at the end of the write cycle. This voltage is read by read circuit 302, and then the potential returned to a level below the shelf voltage. The state of the ferroelectric capacitor will not have changed significantly, provided the charge transferred into or out of the ferroelectric capacitor during the time the potential was above the voltage in question is small. The transferred charge can be minimized by setting the conductive load during the read process sufficiently high and the difference in voltages between the applied voltage and the read shelf voltage as small as possible. For example, the read voltage could be set to $V_{max}$. The shelf voltage that was read can then be translated to the data value that was stored in the ferroelectric memory cell.

The circuit shown in FIG. 13A can also be utilized to implement other readout schemes. As noted above, one method for reading the state of ferroelectric capacitor 201 is to determine the charge needed to complete the transition to the fully polarized UP state front the current state. Referring again to FIG. 13B, in one aspect of the invention, the read circuit determines the difference between the time at which the voltage at node 206 reaches the shelf region, $T_s$, and the time at which the voltage leaves the shelf region, $T_f$ when the write circuit applies a potential of V to the conductive load. The time can be measured directly or determined indirectly by pulsing the conductive load and counting the number of pulses needed to bring the potential at node 206 to $V_f$ during the pulse.

Refer again to FIG. 9A. As noted above, the fraction of the current from the input signal that flows through each branch of the current mirror will not be exactly constant because of the voltage drop across FET 205 when FET 205 is conducting. In some cases, the difference in current split from the ideal case in which a fixed fraction of the current flows through each branch of the current mirror does not alter the operation of the memory cell. For example, if the number of data states that are to be stored in the memory cell is sufficiently small, the resultant errors in programming the ferroelectric capacitor can be tolerated. In this case, the current split will be said to be substantially constant. However, in cases in which more states are needed, an alternative memory cell configuration is preferred.

Figure 14:
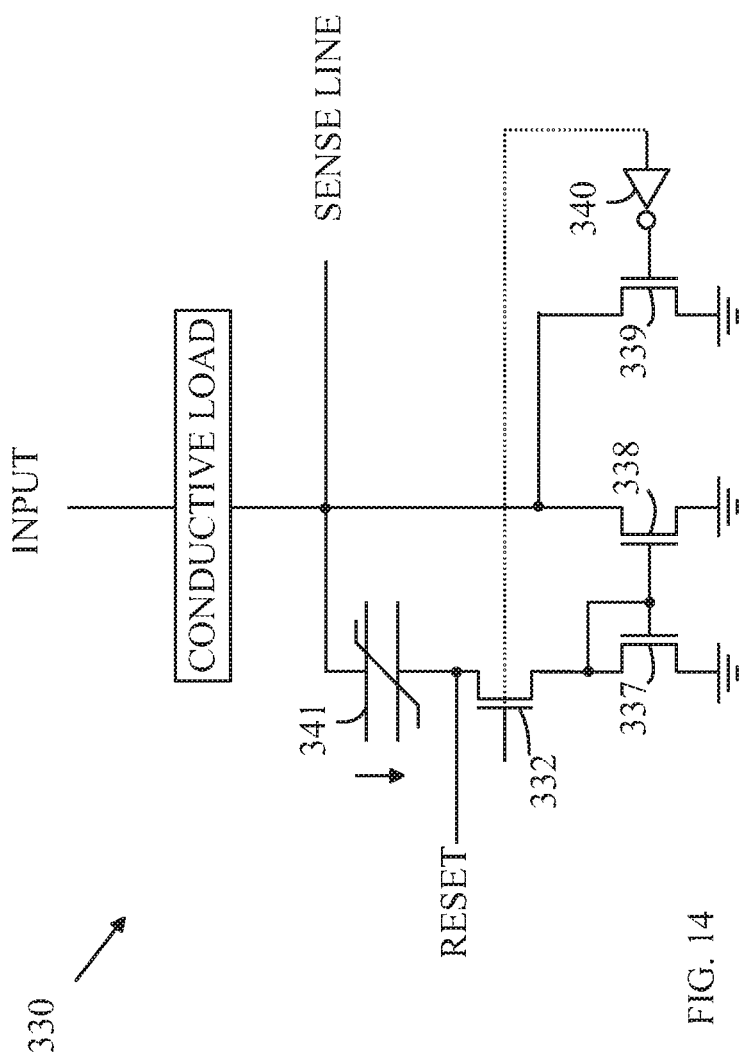
FIG. 14 illustrates a CMOS embodiment of an autonomous memory cell according to the present invention.

Refer now to FIG. 14, which illustrates a CMOS embodiment of an autonomous memory cell according to another embodiment of the present invention. In autonomous memory cell 330, FETs 337 and 338 form a conventional current mirror. During reset, FET 332 is placed in a non-conducting state and FET 339 is set to a conducting state via inverter 340. Hence, a path to ground is provided through FET 339 for the charge leaving ferroelectric capacitor 341 in response to the reset signal.

The above-described embodiments of the present invention utilize PZT ferroelectric capacitors. However, other ferroelectric materials could be utilized for the dielectric medium in the ferroelectric capacitors. For example, ferroelectric capacitors based on PLZT, PLT, barium titanate, bismuth ferrite, PVDF, lithium niobate, Y1 ceramics such as Strontium Bismuth Tantalate Niobate, and various organic polymers such as PVDF could be utilized.

In the above described embodiments, a particular direction of polarization is defined as the UP direction. However, it is to be understood that this definition is arbitrary and the directions for UP and DOWN can be reversed.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A memory cell comprising:
a ferroelectric capacitor; and
a circuit having first and second current paths connected to first and second switch terminals, respectively, said ferroelectric capacitor being connected in series in said first current path such that a current equal to a fixed fraction of a current entering said second switch terminal passes into said ferroelectric capacitor substantially independent of said current entering said second switch terminal, said fixed fraction being less than 1.

2. The memory cell of claim 1 wherein said first current path comprises said ferroelectric capacitor in series with a first FET having a gate shorted to a source of said first FET, and second current path comprises a second FET connected to said second terminals.

3. The memory cell of claim 1 wherein said ferroelectric capacitor is characterized by first and second ferroelectric capacitor terminals, said first ferroelectric capacitor terminal being connected to said first switch terminal, wherein said second current path comprises a first FET having a source connected to said second ferroelectric capacitor terminal, and wherein said first current path comprises a second FET, said first and second FETs being connected to form a current mirror for said first and second current paths.

4. The memory cell of claim 1 wherein said ferroelectric capacitor is characterized by a maximum charge that can be stored in said ferroelectric capacitor and wherein said memory cell further comprises a write circuit connected to said second switch terminal, said write circuit transferring a quantity of charge through said first switch terminal, said quantity of charge being determined by a data value input to said write circuit and being independent of said maximum charge.

5. The memory cell of claim 4 wherein said data value has more than three distinct states.

6. The memory cell of claim 4 further comprising a read circuit that determines an amount of charge that has been stored in said ferroelectric capacitor by said write circuit.

7. The memory cell of claim 6 wherein said read circuit comprises:
a reset capacitor;
a circuit for precharging said reset capacitor to a first voltage;
a circuit that connects said reset capacitor to said ferroelectric capacitor after said reset capacitor has been charged to said first voltage; and
a circuit that measures a voltage on said reset capacitor after said reset capacitor has been connected to said ferroelectric capacitor.

8. The memory cell of claim 7 wherein said ferroelectric capacitor is characterized by a maximum charge that can be stored on said ferroelectric capacitor and a saturation voltage and wherein said first voltage is chosen such that said ferroelectric capacitor is at a voltage greater than said saturation voltage when a charge equal to said maximum charge is transferred from said ferroelectric capacitor to said reset capacitor.

9. The memory cell of claim 6 wherein said ferroelectric capacitor is characterized by a maximum charge that can be stored on said ferroelectric capacitor and wherein said read circuit determines a charge that must be added to a charge stored in said ferroelectric capacitor to cause said ferroelectric capacitor to store said maximum charge.

* * * * *